United States Patent [19]
Nakatsuka et al.

[11] Patent Number: 6,055,256
[45] Date of Patent: Apr. 25, 2000

[54] LASER BEAM PRINTER AND SEMICONDUCTOR LASER DEVICE SUITABLE FOR A LIGHT SOURCE THEREOF

[75] Inventors: Shin'ichi Nakatsuka, Hino; Seiji Maruo, Hitachi; Shinya Kobayashi, Mito; Akira Arimoto, Kodaira; Susumu Saito, Hachioji, all of Japan

[73] Assignee: Hitachi, Ltd., Tokyo, Japan

[21] Appl. No.: 08/841,610

[22] Filed: Apr. 30, 1997

[30] Foreign Application Priority Data

Apr. 30, 1996 [JP] Japan ..................................... 8-109271

[51] Int. Cl.$^7$ ..................................................... H01S 3/085
[52] U.S. Cl. ............................................... 372/46; 372/45
[58] Field of Search ........................................ 372/46, 45

[56] References Cited

U.S. PATENT DOCUMENTS

| | | | |
|---|---|---|---|
| 5,524,013 | 6/1996 | Nakatsuka et al. | 372/45 |
| 5,809,053 | 9/1998 | Nakatsuka et al. | 372/46 |

FOREIGN PATENT DOCUMENTS

| | | |
|---|---|---|
| 31 40 081 A1 | 4/1982 | Germany . |
| 36 28 915 A1 | 3/1987 | Germany . |
| 42 31 550 A1 | 4/1993 | Germany . |
| 57-64718 | 4/1982 | Japan . |
| 62-49315 | 3/1987 | Japan . |
| 62-49316 | 3/1987 | Japan . |
| 63-215088 | 9/1988 | Japan . |
| 63-239891 | 10/1988 | Japan . |
| 5-80640 | 4/1993 | Japan . |

*Primary Examiner*—James W. Davie
*Attorney, Agent, or Firm*—Antonelli, Terry, Stout & Kraus LLP

[57] ABSTRACT

A laser beam printer is provided which is capable of compensating for the difference in diameter between dots every colors and preventing unintentional coloring of the boundary between colors. In a conventional light source used for a printer, a spot diameter thereof is small upon low output and large upon high output. However, in a semiconductor laser device of the present invention, which is used for a light source for a printer, the spot diameter of the light source is controlled so as to be large upon low output and small upon high output. It is thus possible to keep the spot diameter of the laser light source constant. As a result, an irregular color-free laser beam printer can be materialized.

9 Claims, 13 Drawing Sheets

LASER BEAM PRINTER AND SEMICONDUCTOR LASER DEVICE SUITABLE FOR A LIGHT SOURCE THEREOF

BACKGROUND OF THE INVENTION

1. Field of the Invention:

This invention relates to a laser beam printer for printing a plurality of colors and a semiconductor laser device suitable for a light source thereof.

2. Description of the Related Art:

A laser beam printer for printing plural colors has a problem in that when the printing is performed using optic systems independent of each of plurality of colors, the respective colors are shifted in printing position, thus causing the decline in the quality of an image. As a printing method for a color printer, which is free of the occurrence of the problem on such color printing-position shifts, a method is known which is called tri level printing disclosed in U.S. Pat. No. 4,078,929, for example. This is a method of printing toner of different colors through the same optic system, using the ability to select charge polarity represented in the form of two positive and negative types as toner corresponding to colored particles. The principle of its printing is as follows:

The surface of a photoconductor is first charged by a charger. When the photoconductor charged with electricity by the charger is exposed with an intensity-modulated laser beam, the electric charge is removed according to the intensity of the laser beam and the distribution of electric potentials shown in FIG. 2 is formed on the surface of the photoconductor. When such a surface-potential distribution occurs in the surface of the photoconductor, first negatively-charged toner 119 is apt to adhere to a high-potential region 116 corresponding to a portion not exposed with the light or weakly exposed with the light. Neither the negatively-charged toner 119 nor positively-charged toner 120 adheres to an intermediate-potential region 117 formed by the medium exposure of light. On the other hand, the positively-charged toner 120 adheres to a low-potential region 118 strongly exposed with light by its own static electricity. When the intermediate-potential region and the low-potential region are plotted on the photoconductor in dot form and toner adheres to them using the phenomena, two-color printing is allowed. Thus, a plurality of colors can be printed through a single optic system. Since these colors are simultaneously plotted, it is natural that no shift in the color printing position is produced.

As a light source suitable for such a laser beam printer, a semiconductor laser device having a small size and weight property is preferable. For example, a high-output semiconductor laser device disclosed in Japanese Patent Application Laid-Open No. 63(1988)-239891 is known as one example of such a light source. In this type of semiconductor laser device, a lens-shaped structure is provided within a wave-guiding path to prevent self filamentation. The high-output semiconductor laser device is materialized which performs both control on a higher lateral mode and astigmatism compensation and is oscillated in a fundamental mode.

SUMMARY OF THE INVENTION

However, the laser beam printer using the aforementioned tri level printing technique has a tendency to increase dots corresponding to the low-potential region 118, which are plotted by a laser beam of a large output, in size as compared with dots corresponding to the high-potential region 116 and the intermediate-potential region 117 since an image is plotted according to strong or weak modulation of a light output produced from the semiconductor laser device. A problem arises in that an unintended intermediate-potential region is formed at the boundary between the low-potential region 118 and the high-potential region 116.

An object of the present invention is to provide a laser beam printer capable of plotting an image which has no shift in color printing position and in which respective color dots are uniform in size, using a tri level printing technique.

Another object of the present invention is to provide a laser beam printer which utilizes a tri level printing technique capable of performing multi-color printing in a single optic system and has the function of compensating for a size deviation between dots plotted and recorded on a photoconductor by an intensity-modulated output of a semiconductor laser device and keeping it at a predetermined magnitude.

A further object of the present invention is to provide a laser beam printer capable of preventing an unintended intermediate-potential region from being formed at the boundary between a low-potential region and a high-potential region of a distribution of potentials on the surface of a photoconductor.

A still further object of the present invention is to provide a semiconductor laser device having a spot-diameter adjusting function capable of changing the shape of a exposure beam according to the intensity of a laser beam.

The present semiconductor laser device is suitable as a light source for the laser beam printer having the compensating function referred to above.

According to one aspect of the present invention, for solving the aforementioned prior art problems, there is provided a multi-color laser beam printer according to the present invention, including the function of exposing a photoconductor with a laser beam emitted from a laser light source to change the potential on the surface of the photoconductor so that the state of adhesion of colored particles is changed, transferring the colored particles to an object to be printed to thereby perform printing, wave guiding path colored particles having at least two types of colors and charge polarity, and setting a plurality of charge quantities according to the intensity of the exposed laser beam, thereby selecting particles to adhere, comprising:

a spot diameter adjusting function capable of changing the shapes of spots of an outgoing beam and an exposing beam according to the intensity of the laser beam so that when the output of the laser light source is low, a spot diameter is changed greatly and when the output thereof is high, the spot diameter is changed on a minor scale, wave guiding path spot diameter adjusting function being equivalent to a compensation function for compensating for a size deviation between dots plotted and recorded on the photoconductor according to an intensity-modulated output of a semiconductor laser device and keeping it at a predetermined magnitude.

In this case, the spot diameter adjusting function is preferable if the change in spot shape is automatically performed or achieved according to the intensity of the laser beam. Further, the spot diameter adjusting function can be configured so as to be held by the laser light source itself.

According to another aspect of the present invention, there is provided a semiconductor laser device according to the present invention, which is used for a light source of a laser beam printer, the semiconductor laser device at least including an active layer or an active layer such as a multiple-quantum well active layer composed of at least two semiconductor layers different in conductivity from each other and a semiconductor layer interposed between the two semiconductor layers and having a forbidden band width narrower than the two semiconductor layers; and clad layers vertically interposing the active layer therebetween and different in conductivity from each other, the semiconductor laser device also having a wave-guiding structure for trapping light in one direction parallel to the active layer, comprising:

a spot diameter adjusting function for changing the shape of a spot at a laser end surface on a small scale upon high output and on a large scale upon low output according to the shape of the wave-guiding structure or a refractive-index distribution formed within the wave-guiding structure.

The semiconductor laser device of the present invention has the following configuration to have such a spot diameter adjusting function. A resonator of the semiconductor laser device according to the present invention has at least a modulator region and a straight region. More practically, the resonator of the semiconductor laser device further has at least a flared region, a modulator region and a straight region.

The modulator region provided at a portion of the resonator serves so as to effectively execute the spot diameter adjusting function for changing the shape of a spot at a laser end surface on a small scale upon high output and on a large scale upon low output according to the shape of a laser beam wave or a refractive-index distribution formed within a wave-guiding path.

The modulator region may preferably be set to a length less than or equal to one-fourth the cavity length of the resonator along the direction of the optical axis of the resonator. This is why fundamental laser oscillations are naturally maintained within a region other than the modulator region. Incidentally, a resonator region other than the modulator region and the flared region provided in the neighborhood of a crystal end surface will be called "straight region" tentatively.

The flared region is normally provided in the vicinity of the crystal end surface on the light-emitting portion side. The flared region is a region formed by enlarging a light wave-guiding path with an increase in spot diameter of a laser beam. The flared region serves not so as to cause light absorption of the enlarged laser beam. Although the flared region depends on the magnitude of the diameter of the laser beam, it normally uses lengths ranging from about 40 $\mu$m to 60 $\mu$m in the direction of the optical axis of the light resonator.

The length of the resonator of the semiconductor laser device, which has been used so far, is normally enough for the entire length of the light resonator. The length of the light resonator generally ranges from about 300 $\mu$m to 600 $\mu$m. It is needless to say that various resonator lengths can be selected according to purposes. For example, a long resonator length is 1mm as an example.

On the other hand, the resonator length is selected according to various purposes even in the case of the width of the resonator. Resonator lengths ranging from about 4 $\mu$m to 7 $\mu$m are adopted in most cases.

As an optical feedback means, one employed in the semiconductor laser device until now can be used. Namely, a Fabry-Perot resonator, a distributed feedback (DFB) structure, a distributed Bragg reflector, etc. can be used.

Further, various means employed in other semiconductor laser devices, such as a protection film for protection of the crystal end surface, a buffer layer for satisfactory crystal growth, etc., i.e., normal means may be optionally used.

A specific structure of the modulator region will now be described below.

Its typical structure may be configured so as to inject currents through plural stripes such as two parallel stripes at at least a portion of the stripe-like wave-guiding structure constituting the semiconductor laser device. The number of the stripes may be more than or equal to two in principle but two stripes are actually most useful in view of manufacture and characteristic control. The following description will be made with the number of the stripes as two.

The spot diameter adjusting function can be executed by providing a distribution so that the density of current to be injected into a stripe having the two parallel stripe-like wave-guiding structures and the density of current to be injected into a stripe-like wave-guiding structure other than the two parallel stripe-like wave-guiding structures respectively take values different from each other with respect to the same applied voltage.

In order to form the distribution of the injected current density, current non-blocked and blocked regions whose sizes do not exceed 10 $\mu$m, are preferably provided within the two parallel stripe-like wave-guiding structures in mixed form, respectively. As shown in FIGS. 6 and 7 by way of example, dot-like patterns 202 are provided and a current non-blocked region 134 may be mixed with a current blocked region. Alternatively, a number of extremely thin line patterns may be used in place of the dot-like patterns 202. In short, the patterns provided within the modulator region may be patterns of such a type that a portion of the resonator is mixed with the current non-blocked and blocked regions and thereby a distribution of the density of current to be injected is formed. The distribution of the density of the current to be injected allows the formation of a distribution of a refractive index at the portion of the resonator.

In order to form the distribution of the current density, additive resistances, i.e., e.g., a low doping density p-GaAs layer whose carrier density does not exceed 1017 cm-3, or an electrical barrier, i.e., a voltage dropping layer 301 shown in FIG. 10 may be preferably provided.

As a preferred embodiment of a laser beam printer according to the present invention, a printer is provided which has a compensating function for changing the shape of an exposure beam emitted from an exposure device constituting a laser beam printer using a tri level printing technique capable of performing multi-color printing in a single optic system, according to the intensity of a laser beam, controlling a spot diameter on a large scale upon low output and on a small scale upon high output, and maintaining a size deviation or difference in diameter between dots plotted and recorded on a photoconductor at predetermined magnitude. Such a change in spot diameter can be implemented in accordance with only processing inside the laser beam printer by adding the function for automatically changing the shape of the spot according to the intensity of the laser beam to the exposure device. The implementation of such a change of the spot shape or spot diameter by use of the function of the semiconductor laser device itself used as the light source allows the configuration of a laser beam printer of a simplified system.

As a preferred embodiment of a semiconductor laser device according to the present invention, which is used as a light source for the laser beam printer, a semiconductor laser device is provided which has a spot diameter adjusting function for changing the shape of a spot at a laser end surface on a small scale upon high output and on a large scale upon low output according to the shape of a wave or a refractive index distribution in a wave-guiding path. In the semiconductor laser device referred to above, the spot diameter adjusting function can be implemented or achieved by injecting currents through two parallel stripes at at least a portion of a stripe-like wave-guiding path. In order to make a change in output and a change in beam diameter on a desired correlation basis, the density of the current to be injected into a stripe having the two parallel stripes and the density of the current to be injected into a stripe other than that stripe are changed so as to obtain desired characteristics. Since a lens provided within the wave-guiding path does not have the function of externally adjusting its refractive index, the semiconductor laser device provided with the aforementioned conventional lens-shaped structure cannot be used as the changeable light source of the above-described laser beam printer, which is suitable for compensation for a spot diameter.

Typical ones of various inventions of the present application have been shown in brief. However, the various inventions of the present application and specific configurations of these inventions will be understood from the following description.

BRIEF DESCRIPTION OF THE DRAWINGS

FIG. 5c is an enlarged view of a portion indicated by a circular region A1 in FIG. 5a;

FIG. 6b is an enlarged view of a portion indicated by a circular region B1 in FIG. 6a;

FIG. 7c is an enlarged view of a portion indicated by a circular region A1 in FIG. 7a;

FIG. 15c is an enlarged view of a portion indicated by a circular region A2 in FIG. 15a;

FIG. 17c is an enlarged view of a portion indicated by a circular region A3 in FIG. 17a;

DETAILED DESCRIPTION OF THE PREFERRED EMBODIMENTS

Laser printers and semiconductor laser devices suitable for their light sources, according to the present invention will hereinafter be described in detail by further specific embodiments with reference to the accompanying drawings.

<First embodiment>

Figure 1:
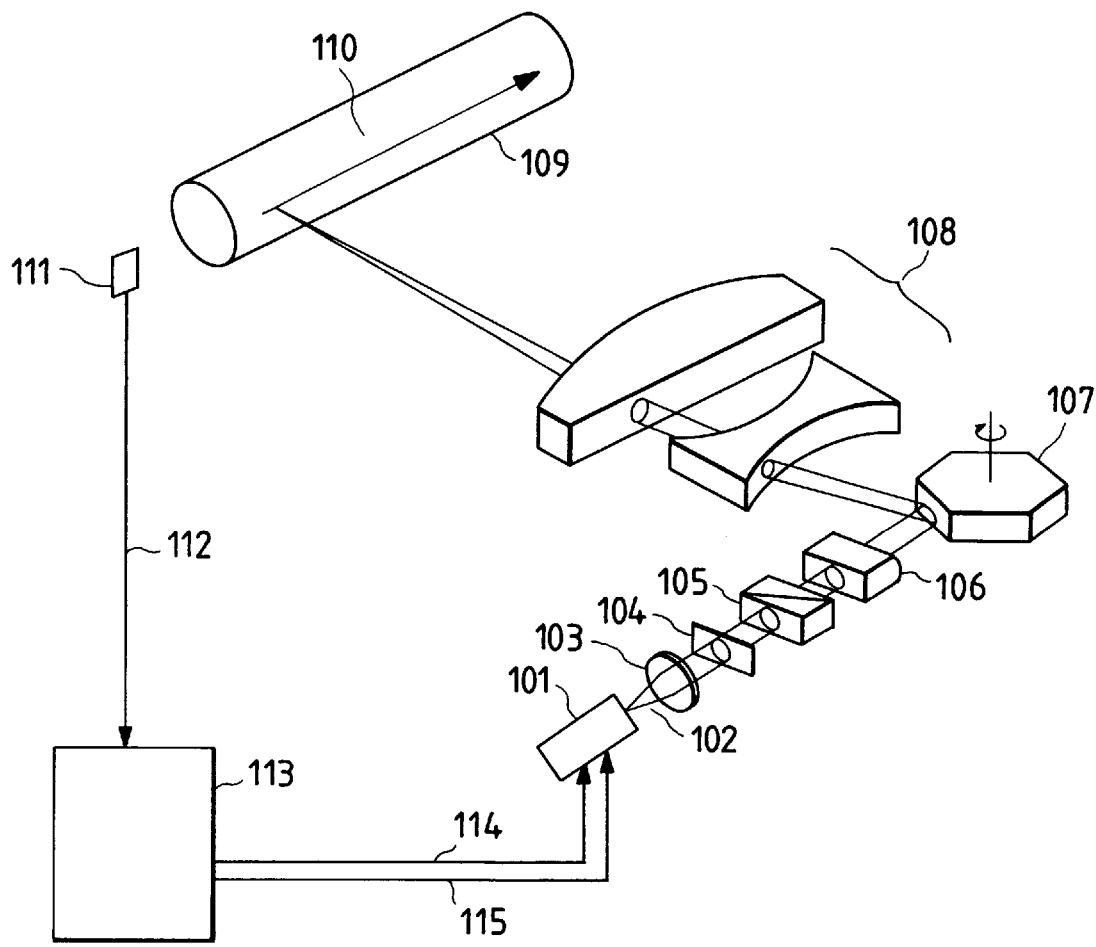
FIG. 1 is a configurational view of an exposure device showing one embodiment of a laser beam printer according to the present invention.

A laser beam printer according to the present invention and a first embodiment of a semiconductor laser device suitable for its light source will be described. FIG. 1 is a view showing one configurational example of an exposure device employed in the laser beam printer of the present invention. In FIG. 1, reference numeral 101 indicates a semiconductor laser device. A laser beam 102 emitted from the semiconductor laser device 101 passes through a collimator lens 103, a light-quantity control filter 104, a beam splitter 105 and a cylindrical lens 106 so as to enter a polygon mirror 107 of a light deflector. Next, the laser beam 102 is reflected and deflected under the rotation of the polygon mirror 107. The cylindrical lens 106 serves so as to allow the laser beam 102 to converge on a line orthogonal to a rotatable shaft of the polygon mirror 107 on the surface thereof in order to compensate for scan position displacements produced due to parallelism errors of the polygon mirror 107. Further, the laser beam 102 converges on a scan surface covered with a photoconductor material (hereinafter abbreviated simply "photoconductor") 109 by a scan lens system 108 so as to repeatedly scan on a scan position 110 with constant velocity. Incidentally, the scan surface is moving in the direction orthogonal to a beam scanning direction with constant velocity. The light detector 111 detects a start position of a scanning beam and sends the detected signal to a controller 113 as a synchronizing signal 112.

Figure 2:
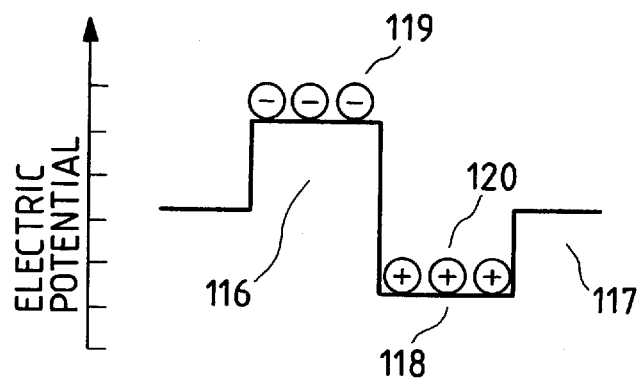
FIG. 2 is a distribution view of surface potentials and toner for explaining the principle of multi-color printing.

As the distribution of surface potentials is typically shown in FIG. 2, regions having potentials of three types: a first region 116, a second region 117 and a third region 118 corresponding to the intensity of the laser beam 102 are formed on the surface of the photoconductor 109 exposed with the laser beam 102. A first colored particle 119 and a second colored particle 120 having different colors are successively caused to adhere to the photoconductor 109 drawing such surface potentials thereon so that they adhere only to the positions of the surface potentials corresponding to their particle charge characteristics. Namely, the negatively-charged first particle 119 adheres to the first region 116 whose surface potential is high, and the positively-charged second particle 120 adheres to the third region 118 whose surface potential is low. Any particles do not adhere to the second region 117 kept at an intermediate potential.

Figure 3A:
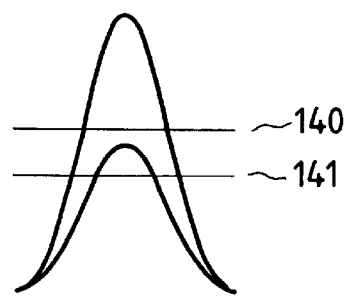
FIG. 3a is a view typically showing a light-intensity distribution at exposure of a conventional semiconductor laser device.

When the above-described printing is performed using a light source corresponding to a normal semiconductor laser device, dots in the third region 118 plotted by light strong in intensity are larger than dots in the second region 117. This is because the intensity of exposing light normally has a strong distribution at its central portion as shown in FIG. 3(a) and it is necessary to set light intensity to a range in which the central portion thereof does not reach exposure intensity 140 required to create the potential of the third region 118, upon plotting the second region 117, whereas upon plotting the third region 118, stronger exposure is required to set, as small as possible, a region corresponding to exposure intensity 141 required to create the potential of the second region 117 formed around the third region 118.

Figure 3B:
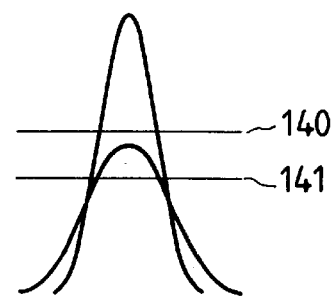
FIG. 3b is a view typically illustrating a light-intensity distribution at exposure of a semiconductor laser device according to the present invention.
Figure 4:
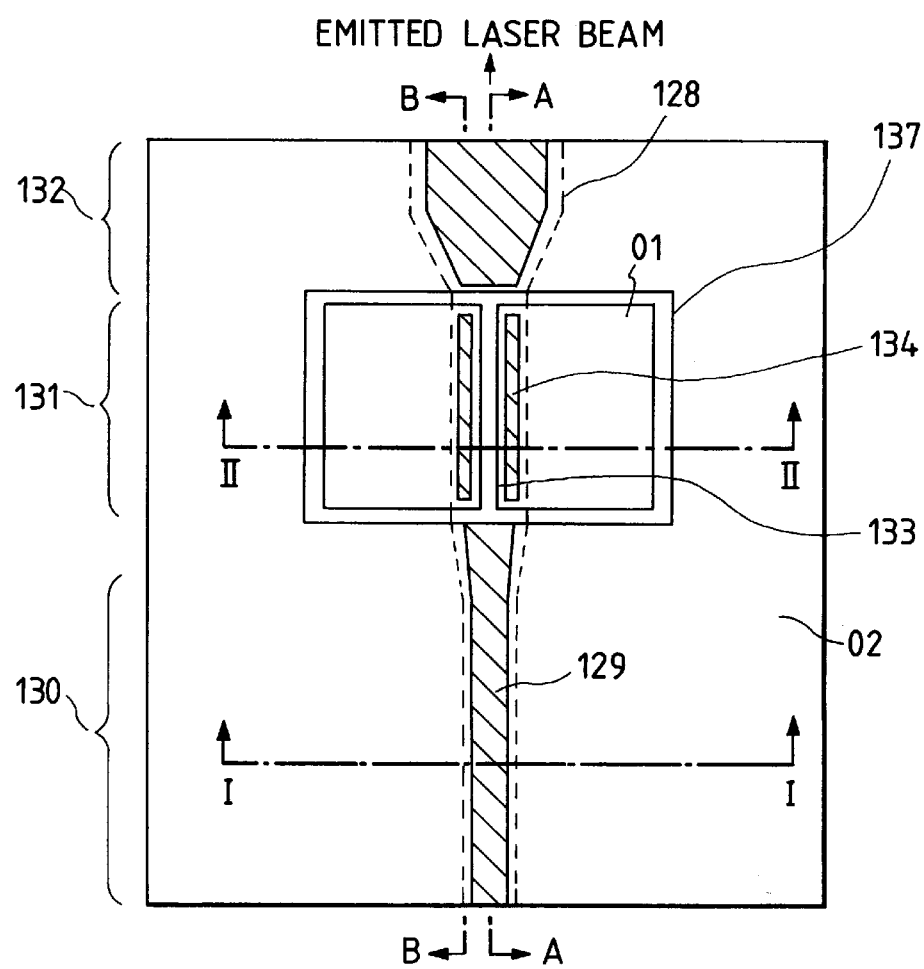
FIG. 4 is a plan view showing a first embodiment of a semiconductor laser device according to the present invention.
Figure 5A:
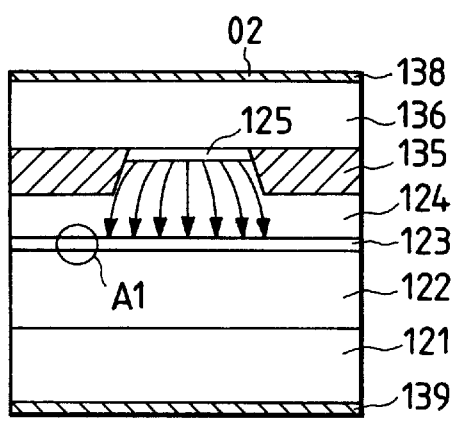
FIG. 5a is a section structural view of a portion taken along line I—I of the semiconductor laser device shown in FIG. 4.
Figure 5B:
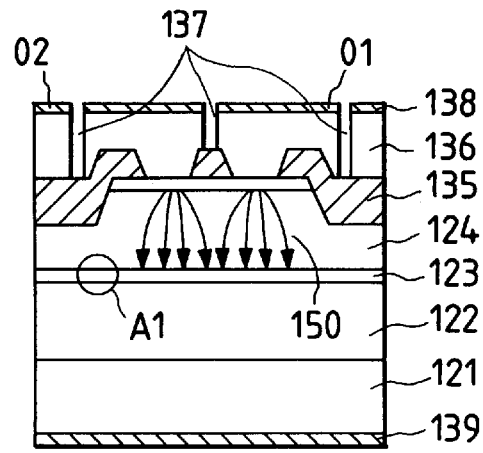
FIG. 5b is a section structural view of a portion taken along line II—II of the semiconductor laser device shown in FIG. 4.
Figure 5C:
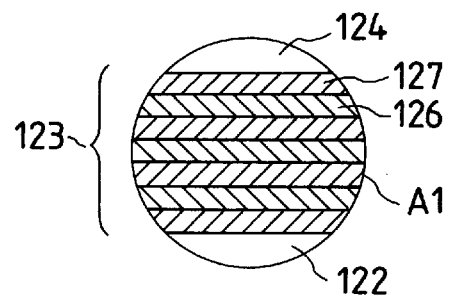

Thus, the semiconductor laser device used as the light source for the laser beam printer according to the present invention is configured so as to be able to control a spot diameter of a laser beam to a large diameter upon low output and to a small diameter upon high output as shown in FIG. 3(b). The semiconductor laser device having such a beam-diameter control function is shown in FIGS. 4 and 5. FIG. 4 is a plan view showing the semiconductor laser device of the present embodiment, FIG. 5(a) is a section structural view of a portion taken along line I—I in FIG. 4, FIG. 5(b) is a section structural view of a portion taken along line II—II in FIG. 4, and FIG. 5(c) is an enlarged view of a circular region indicated by A1 in FIG. 5(a). The semiconductor laser device having such a structure is formed in the following manner.

Firstly, an n-$(Al_{0.5}Ga_{0.5})_{0.5}In_{0.5}P$ multiple-quantum well active layer 123, a p-$(Al_{0.5}Ga_{0.5})_{0.5}In_{0.5}P$ clad layer 124 and a p-GaAs contact layer 125 are successively crystal-grown on an n-GaAs substrate 121 by an organometal vapor-phase deposition. As shown in FIG. 5(c), the multiple-quantum well active layer 123 is formed by alternately stacking three $Ga_{0.5}In_{0.5}P$ well layers 126 and four $(Al_{0.5}Ga_{0.5})_{0.5}In_{0.5}P$ barrier layers 127. For example. a composition $(Al_{0.5}Ga_{0.5})_{0.5}In_{0.5}P$ teaches $(Al_{0.5}Ga_{0.5})_{0.5}In_{0.5}P$.

Next, a complex mask composed of a strip-like photoresist 128 and a $SiO_2$ layer or film 129 is formed in a shape shown in FIG. 4 by using a thermal CVD process and a photolithography technique. In a mask pattern of the photoresist 128, a stripe 130 assuming most of elements and having a normal width (about 4 $\mu$m) expands into two-stage regions: a region 131 having an intermediate width and a region 132 expanded in flare form, in the vicinity of an end surface thereof. The region 132 is widened so that even laser output light having a beam diameter expanded to the maximum by broadening an outgoing width of a wave guiding path can be guided with less losses. After portions of the p-GaAs contact layer 125 and the p-$(Al_{0.5}Ga_{0.5})_{0.5}In_{0.5}P$ clad layer 124 have been etched with the photoresist 128 as a mask, the photoresist 128 is removed. Thereafter, an n-GaAs block layer 135 is selectively grown again by the organometal vapor-phase deposition with the remaining $SiO_2$ 129 as a mask. As a result, a central portion of the intermediate-width region 131 is formed as a current blocked region 133 and a peripheral portion thereof is formed as a current non-blocked region 134.

In order to reduce series resistances of the elements, a p-GaAs cap layer 136 is formed after removal of the $SiO_2$ film 129. A groove 137 shown in FIG. 4 from which the p-GaAs cap layer 136 has been removed, is defined between the intermediate-width region 131 and other regions so that the amount of supply of the current to the intermediate-width region 131 can be controlled independently of the normal-width stripe 130.

Next, a surface electrode 138 composed principally of Au is formed on the surface of a semiconductor wafer corresponding to the respective regions and the back of the GaAs substrate 121 is etched by mechanical grinding and chemical etching so that the remaining thickness is set to about 100 $\mu$m. Thereafter, a back electrode 139 composed principally of Au is also formed on the GaAs substrate 121 side. The semiconductor wafer subjected to such a manufacturing process is cleaved in bar form at about 600 $\mu$m intervals in the lengthwise direction of the stripe. It is needless to say that, for example, molecular beam epitaxy or the like may be used in addition to the organometal vapor-phase deposition and the like for purposes of the above-described crystal growth.

In the so-formed semiconductor laser device of the present embodiment, the normal-width region 130 is similar in sectional structure to a conventional refractive-index wave-guiding semiconductor laser device as shown in FIG. 5(a). On the other hand, since typically-illustrated current paths 150 are formed in the intermediate-width region 131, i.e., a distribution of the amount of current to be injected is formed therein as shown in FIG. 5(b), a refractive index distribution in which the refractive index is large at the central portion of the stripe, is formed. As a result, a lens effect, i.e., an effect can be obtained which allows the laser beam to converge by spatially modulating the phase of the laser beam. Since the control on the current to be supplied to the intermediate-width region 131 permits control on the lens effect, the desired change in spot diameter can be obtained by controlling a main current 114 and an intermediate-width region current 115 shown in FIG. 1 so that the spot diameter is increased when a laser output is low and the spot diameter is reduced when the laser output is large.

Figure 5D:
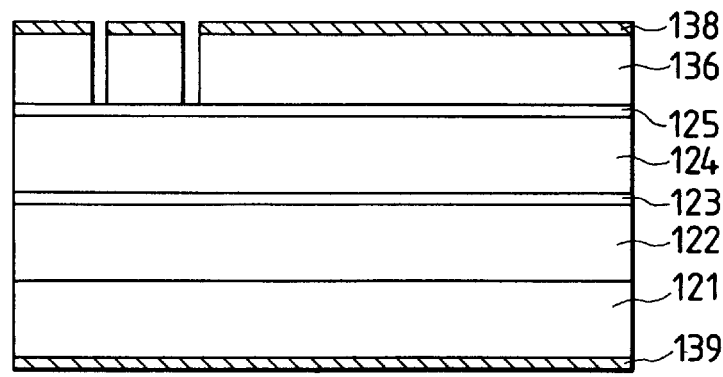
FIG. 5d is a cross-sectional view taken along line A—A of the semiconductor laser device of FIG. 4.
Figure 5E:
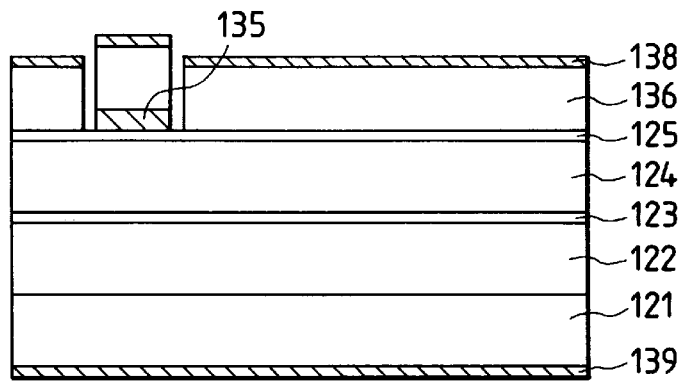
FIG. 5e is a cross-sectional view taken along line B—B of the semiconductor laser device of FIG. 4.

FIG. 5d is a cross-sectional view of the semiconductor laser device, taken along line A—A of FIG. 4. FIG. 5e is a cross-sectional view taken along line B—B of FIG. 4. The same elements of structure as those above are identified by the same reference numerals.

Thus, the laser beam printer of the present embodiment using the tri-level printing technique capable of providing multi-color printing in the single optic system can be easily provided with the function of, using the semiconductor laser device having the structure shown in FIGS. 4 and 5, controlling the two currents 114 an 115 and thereby compensating for the difference in diameter between the dots plotted and recorded on the photoconductor so as to keep the difference at a predetermined magnitude. Since the difference can be held constant, a laser beam printer can be materialized which is capable of preventing an unintended intermediate region from being formed at the boundary between a low potential region and a high potential region.

Figure 18:
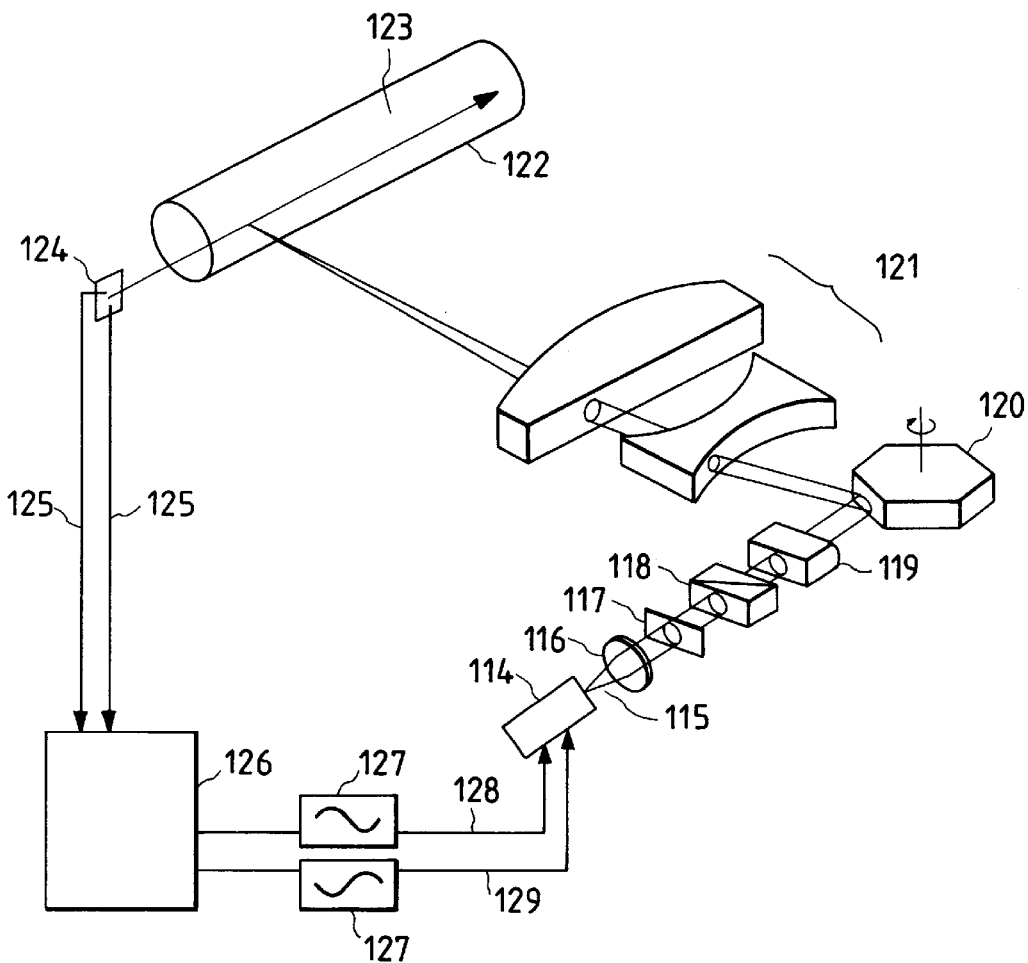
FIG. 18 is a configurational view of an exposure device showing another embodiment of a laser beam printer according to the present invention.

Another embodiment of the laser beam printer according to the present invention will now be described. FIG. 18 is a view showing one configurational example of an exposure device employed in another laser beam printer according to the present invention. Reference numeral 114 shown in FIG. 18 indicates a semiconductor laser device. A laser beam 115 emitted from the semiconductor laser device 114 passes through a collimator lens 116, a light-quantity control filter 117, a beam splitter 118 and a cylindrical lens 119 so as to enter a polygon mirror 120 of a light deflector. Next, the laser beam 115 is reflected and deflected under the rotation of the polygon mirror 120. The cylindrical lens 119 serves so as to allow the laser beam 115 to converge on a line orthogonal to a rotatable shaft of the polygon mirror 120 on the surface thereof in order to compensate for scan position displacements produced due to parallelism errors of the polygon mirror 120. Further, the laser beam 115 is caused to converge on a scan surface covered with a photoconductor material (hereinafter abbreviated simply "photoconductor") 122 by a scan lens system 121 so as to repeatedly scan on a scan position 123 with constant velocity. Incidentally, the scan surface is moving in the direction orthogonal to a beam scanning direction with constant velocity. The light detector 124 detects a start position of a scanning beam and sends the detected signal to a controller 126 as signals 130 and 131.

Figure 20:
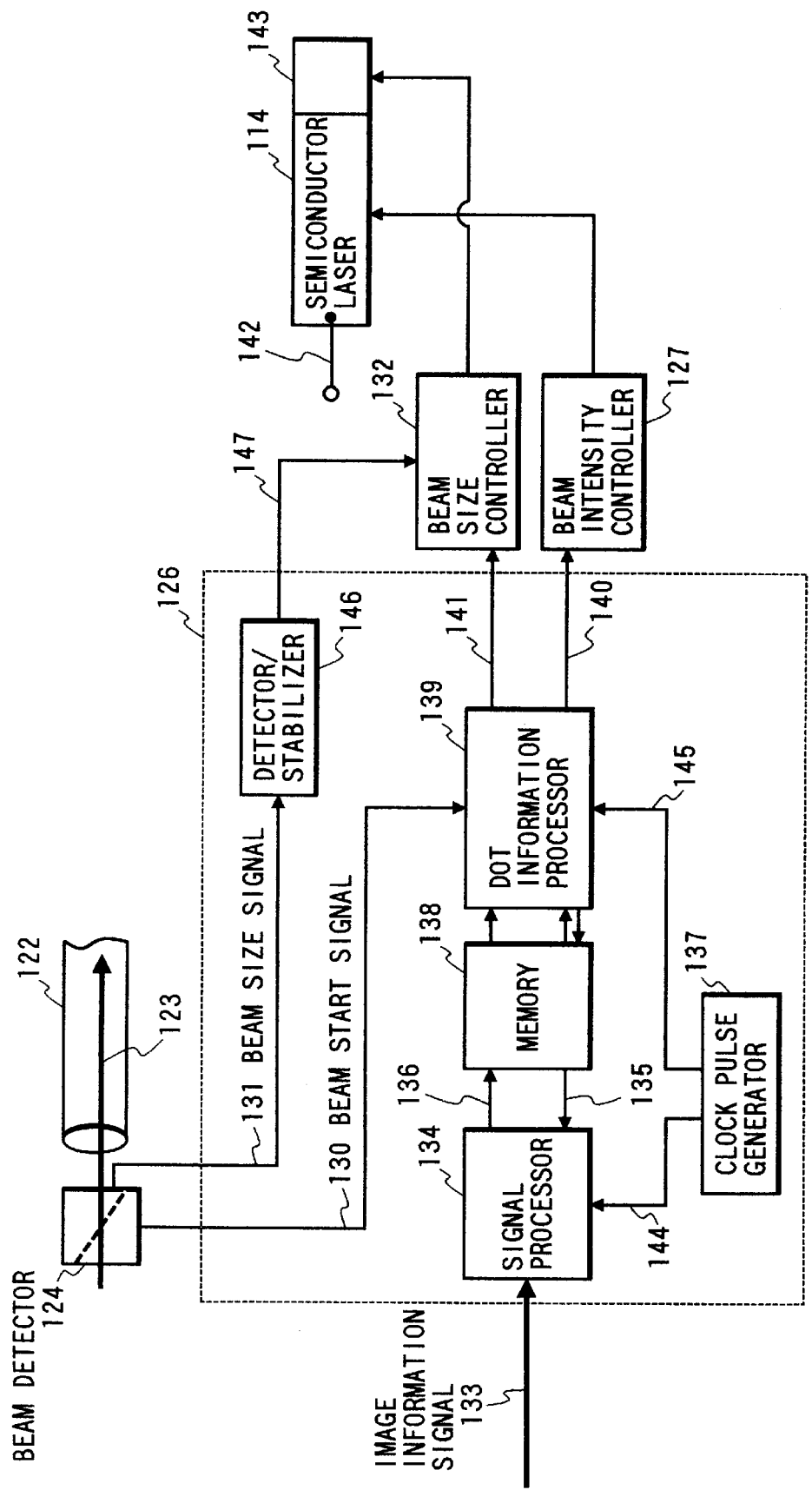
FIG. 20 is a block diagram of a control system of an exposure device portion employed in the laser beam printer shown in FIG. 18.

FIG. 20 is a block diagram showing a control circuit unit of the exposure device employed in the laser beam printer shown in FIG. 18.

Figure 19:
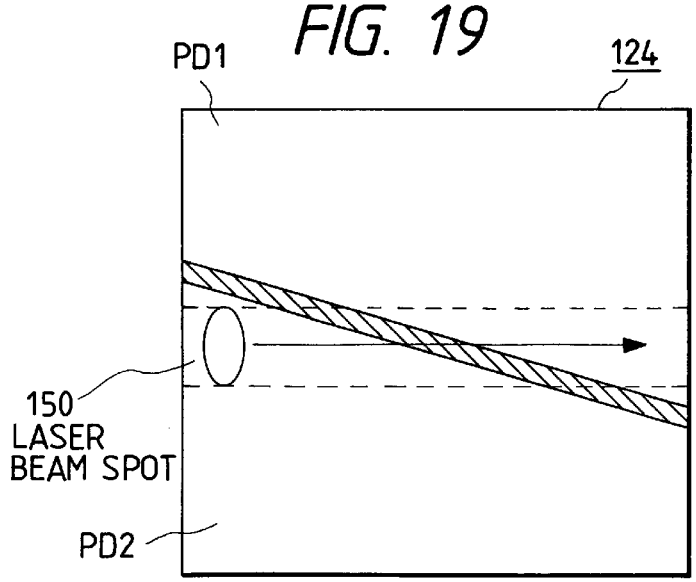
FIG. 19 is a plan view illustrating a configuration of a diode of a light detector.

FIG. 19 is a plan view showing a configuration of a diode of the light detector 124 shown in FIG. 18.

The light detector 124 is divided into a scan start-signal detecting photodiode PD2 for detecting a beam scan start time and a beam size detecting photodiode PD1 having a side provided at an angle of about 2 degrees with respect to a scanning line and for detecting a beam size from the time required for a signal detected upon passage of a scanning beam through the side to rise. An oblique line in FIG. 19 indicates a photodiode separation region.

Figure 21:
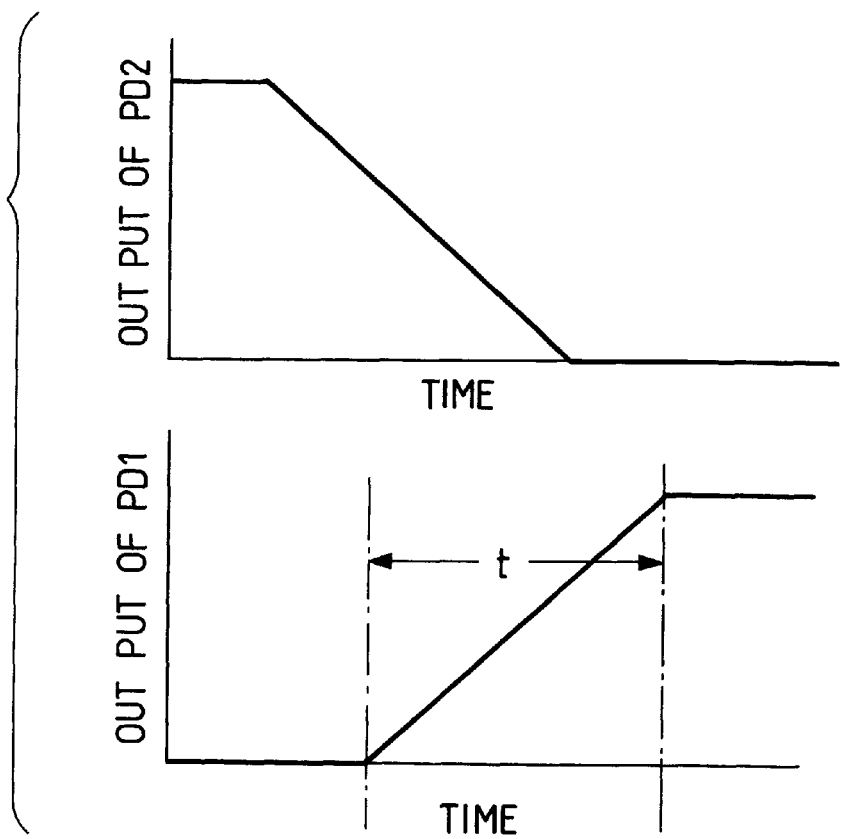
FIG. 21 is a diagram for describing actuating signals of two diodes of a light detector.

FIG. 21 is diagram for describing actuating signals of the light detector 124. When a laser beam starts scanning, the scan start-signal detecting photodiode PD2 first generates a signal 151 therefrom. When a laser spot 150 approaches the next beam size detecting photodiode PD1, the beam size detecting photodiode PD1 generates an output 152 in turn. When the laser spot 150 completely falls within the beam size detecting photodiode PD1, its output is kept constant. A spot size of the laser beam can be detected from the time t that elapsed between the starting of the output and its fixing.

A printing signal 133 inputted from the outside of the printer is converted into a dot size signal 136 for determining a dot size and a dot ON/OFF signal 135 for controlling the turning ON and OFF of a dot by a signal control processor 134. The so-converted signals are stored in a memory 138. The signal control processor 134 and the memory 138 are activated synchronously in accordance with clock signals 144 and 145 generated from a clock signal generator 137. A dot information processor 139 electrically processes the signals stored in the memory 138 in response to a beam scan start signal to generate modulating signals for a beam size control circuit 132 and a laser output control circuit 127. The laser output control circuit 127 supplies a current to a laser intensity control electrode 142 of a semiconductor laser device 114 in response to the signal outputted from the dot information processor 139. Similarly, the beam size control circuit 132 supplies a current to a beam diameter control electrode 143 of the semiconductor laser device 114 in response to the signal outputted from the dot information processor 139. The beam size control circuit 132 determines a current value, based on a beam size signal in addition to the signal sent from the dot information processor 139 as well as by reference to a beam size feedback signal 147 generated from a beam size detection/reference value stabilizing circuit 146.

A predetermined effect could be obtained from the embodiment of the hitherto-described exposure device using a similar semiconductor laser device.

Figure 5F:
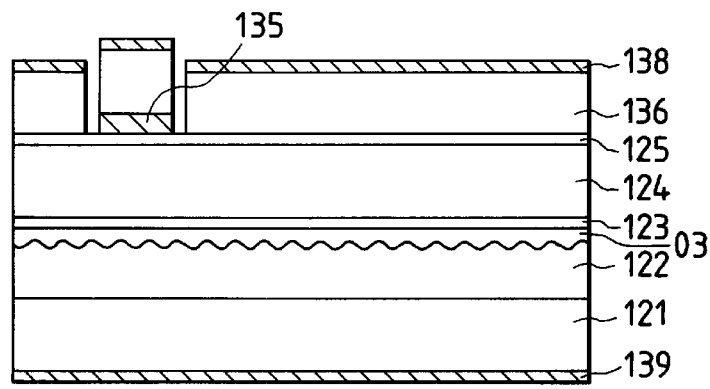
FIG. 5f is a cross-sectional view taken along line A—A of a distributed feedback type of semiconductor laser device of FIG. 4.
Figure 5G:
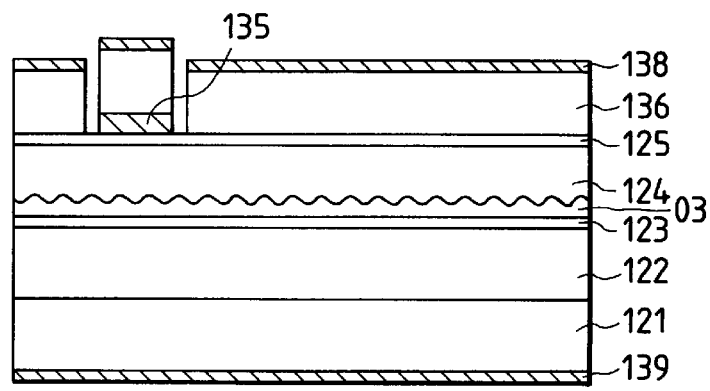
FIG. 5g is a cross-sectional view taken along line B—B of a distributed feedback type of semiconductor laser device of FIG. 4.

An example in which a distribution feedback type is used as the semiconductor laser device, will next be described. The present distribution feedback type semiconductor laser device is similar in basic modulation region configuration to the semiconductor laser device using the aforementioned normally-used Fabry-Perot resonator. Thus, its plan view is similar to FIG. 4. FIG. 5f is a cross-sectional view of the distribution feedback type semiconductor laser device, taken along line A—A of FIG. 4. Similarly, FIG. 5g is a cross-sectional view taken along line B—B of FIG. 4. In the drawings, the same elements of structure as those above are identified by the same reference numerals. In FIGS. 5f and 5g, a diffraction grating is formed within a waveform boundary region between an layer (Al0.5Ga0.5)0.5In0.5P 122 and an (Al0.3Ga0.7)0.5In0.5P layer 03.

Even in the case of the distribution feedback type semiconductor laser device, the spot diameter can be controlled.

<Second embodiment>

Figure 6A:
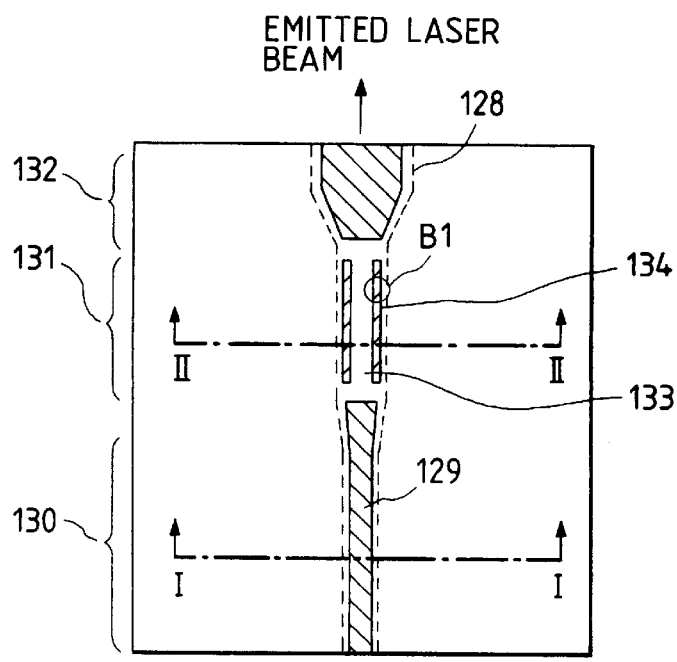
FIG. 6a is a plan view illustrating a second embodiment of a semiconductor laser device according to the present invention.
Figure 6B:
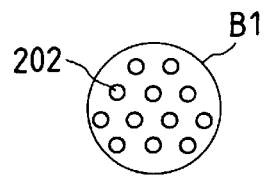

A laser beam printer according to the present invention and a second embodiment of a semiconductor laser device used for a light source of the laser beam printer will be described with reference to FIGS. 6(a)–6(b) and 7(a)–7(c). A configuration of an exposure device employed in the laser beam printer of the present embodiment is different from the configuration of the first embodiment in that the current control for driving the semiconductor laser device is performed on a two-system basis in the first embodiment, whereas it is performed on a simpler one-system basis in the second embodiment. Accordingly, the current 115 flowing in the intermediate-width region 131 shown in FIG. 1 becomes unnecessary. The structure of the semiconductor laser device used as the light source of the laser beam printer is as follows: FIG. 6(a) is a plan view showing the semiconductor laser device of the present embodiment, FIG. 6(b) is an enlarged view of a circular region indicated by B1 in FIG. 6(a), FIG. 7(a) is a section structural view of a portion taken along line I—I in FIG. 6(a), FIG. 7(b) is a section structural view of a portion taken along line II—II in FIG. 6(a), and FIG. 7(c) is an enlarged view of a circular region indicated by A1 in FIG. 7(a).

The semiconductor laser device of the present embodiment is substantially identical in basic structure to the first embodiment but different from the first embodiment only in the partial structure of the intermediate-width region 131. Namely, the present embodiment is different from the first embodiment in that as against the provision of the groove 137 within the intermediate-width region 131 with the p-GaAs cap layer 136 removed from the groove 137 in the first embodiment, dot-like patterns 202 each having a diameter of about 2 μm are provided within a current non-blocked region 134 of the intermediate-width region 131 without the groove 137 in the present embodiment as shown in FIGS. 6(a) and 6(b). As shown in FIGS. 6(a) and 7(b), a central portion of the intermediate-width region 131 serves as a current blocked region 133 and a peripheral portion thereof serves as the current non-blocked region 134. Further, a current blocked region formed by the dot-like patterns 202 exists within the current non-blocked region 134 in a mixed state. The dot-like patterns 202 are formed as a portion of a pattern of $SiO_2$ 129 in a complex mask composed of a photoresist 128 and $SiO_2$ 129. Therefore, only a current-injection configuration can be shaped in dot form without affecting the configuration of a wave-guiding path. The area of the current non-blocked region 134 for the dot-like patterns 202 with respect to the entire area of the wave-guiding path, which is specified by the photoresist 128, can be arbitrarily set according to the mask design of photolithography. Accordingly, a method of manufacturing the semiconductor laser device of the present embodiment does not include only the process of forming the groove 137, which is applied to the manufacturing method used in the first embodiment. In the present embodiment, the density of the area of each dot-like pattern 202 is set as about 50%. The size of each dot-like pattern 202 may preferably have 10 μm or less because if the size thereof is set to a large dot exceeding 10 μm, then a current non-blocked region formed by the dot-like patterns expands to form a region for absorbing light into an active layer, thus increasing an operating current, so that characteristics are deteriorated. The minimum size of each dot-like pattern 202 depends on the photolithography technique but may be about 0.1 μm.

Figure 7A:
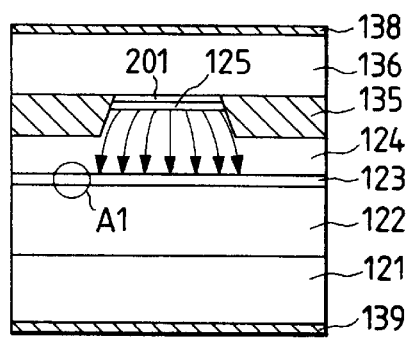
FIG. 7a is a section structural view of a portion taken along line I—I of the semiconductor laser device shown in FIG. 6.
Figure 7B:
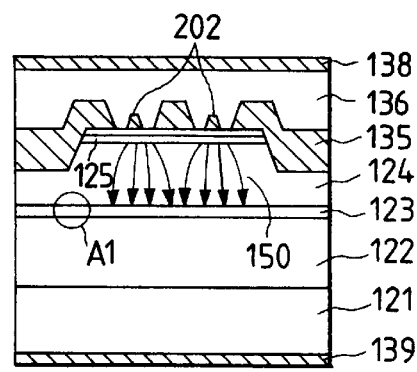
FIG. 7b is a section structural view of a portion taken along line II—II of the semiconductor laser device shown in FIG. 6.
Figure 7C:
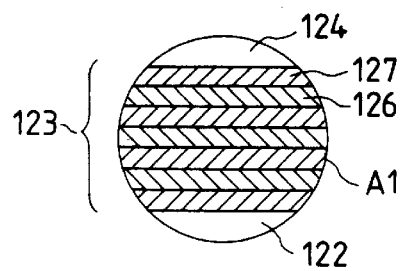

In the semiconductor laser device of the present embodiment, a normal-width region 130 is similar in structure to the conventional refractive-index wave-guiding semiconductor laser device as shown in FIG. 7(a). On the other hand, since typically-illustrated current paths 150 are formed in the intermediate-width region 131, i.e., a distribution of the amount of current injected is formed therein as shown in FIG. 7(b), a refractive index distribution in which the refractive index is large at the central portion of a stripe, is formed so that a lens effect can be obtained. Since a current path in the intermediate-width region 131 is partially interrupted, the density of the current to be injected into the intermediate-width region 131 is lowered as compared with the normal-width region 130. Thus, when a laser output is low, the lens effect becomes weak and a large spot is obtained. On the other hand, when the laser output is high, the lens effect becomes strong and a small spot is obtained. The relationship between each spot diameter obtained in this way and the light output can be designed according to the characteristics of the laser beam printer by changing the density of the current flowing in the intermediate-width region 131. The semiconductor laser device of the present embodiment can obtain a change in spot diameter similar to the first embodiment by forming a surface electrode 138 as a single electrode alone.

Thus, the laser beam printer of the present embodiment using the tri-level printing technique capable of providing multi-color printing in the single optic system can be provided with the function of compensating for the difference in diameter between the dots plotted and recorded on a photoconductor and keeping the difference at a predetermined magnitude in a manner similar to the first embodiment by simply controlling the main current 114 shown in FIG. 1, using the semiconductor laser device having the structure shown in FIGS. 6 and 7 as a light source for the laser beam printer. Since the difference can be held constant, a laser beam printer can be materialized which is capable of preventing an unintended intermediate region from being formed at the boundary between a low potential region and a high potential region.

<Third embodiment>

Figure 8:
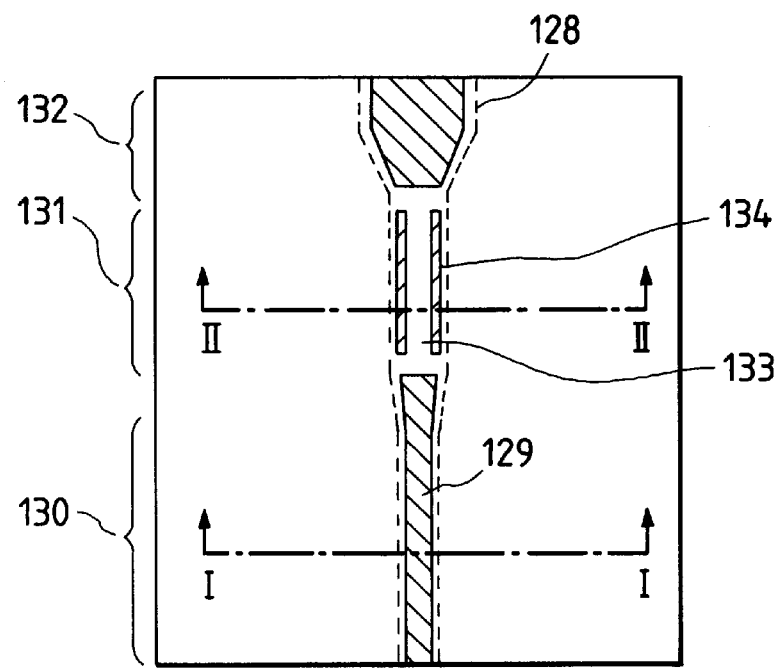
FIG. 8 is a plan view illustrating a third embodiment of a semiconductor laser device according to the present invention.

A laser beam printer according to the present invention and a second embodiment of a semiconductor laser device used for a light source of the laser beam printer will be described with reference to FIGS. 8 through 10. A configuration of an exposure device employed in the laser beam printer of the present embodiment is as follows: The current control for driving the semiconductor laser device is performed on a one-system basis in a manner similar to the second embodiment and the drive current 115 is omitted from the configuration shown in FIG. 1. The present embodiment is different from the second embodiment 2 in that the semiconductor laser device having a beam diameter control function, which is used as the light source, operates at low currents as compared with the second embodiment. FIG. 8 is a plan view showing the semiconductor laser device according to the present invention, FIG. 10(a) is a section structural view of a portion taken along line I—I in FIG. 8, and FIG. 10(b) is a section structural view of a portion taken along line II—II in FIG. 8. The semiconductor laser device having such a structure is formed as follows:

Firstly, an n-$(Al_{0.5}Ga_{0.5})_{0.5}In_{0.5}P$ clad layer 122, a multiple-quantum well active layer 123, a p-$(Al_{0.5}Ga_{0.5})_{0.5}In_{0.5}P$ clad layer 124, a p-GaAs contact layer 125 and a p-$Ga_{0.7}In_{0.3}As_{0.4}P_{0.6}$ voltage dropping layer 310 are successively crystal-grown on an n-GaAs substrate 121 by an organometal vapor-phase deposition. The multiple-quantum well active layer 123 is similar in configuration to one shown in FIG. 7(c) of the second embodiment and is formed by alternately stacking three $Ga_{0.5}In_{0.5}P$ well layers 126 and four $(Al_{0.5}Ga_{0.5})_{0.5}In_{0.5}P$ barrier layers 127.

Next, a complex mask composed of a strip-like photoresist 128 and $SiO_2$ 129 is formed in a shape shown in FIG. 8 by using a thermal CVD process and a photolithography technique. In a mask pattern of the photoresist 128, a stripe 130 assuming most of elements and having a normal width (about 2 μm) expands into two-stage regions: a region 131 having an intermediate width and a region 132 expanded in flare form, in the vicinity of an end surface thereof. After portions of the p-$Ga_{0.7}In_{0.3}As_{0.4}P_{0.6}$ voltage dropping layer 301, the p-GaAs contact layer 125 and the p-$(Al_{0.5}Ga_{0.5})_{0.5}In_{0.5}P$ clad layer 124 have been etched with the photoresist 128 as a mask, the photoresist 128 is removed. Thereafter, the so-processed product is etched by about 0.5 $\mu$m again with the remaining $SiO_2$ 129 as a mask. After removal of the $SiO_2$ mask, the p-$Ga_{0.7}In_{0.3}As_{0.4}P_{0.6}$ voltage dropping layer 301 other than the intermediate-width region 131 is removed and an n-$(Al_{0.5}Ga_{0.5})_{0.5}In_{0.5}P$ block layer 302 is grown by the organometal vapor-phase deposition.

Figure 9A:
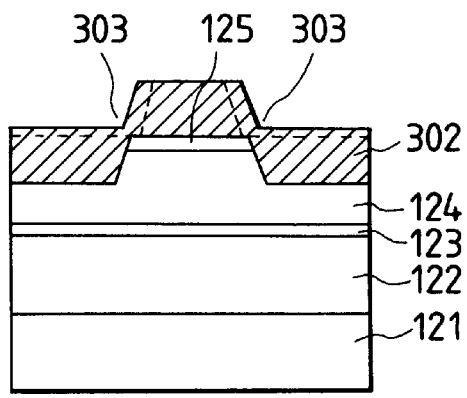
FIGS. 9a and 9b are views showing cross-sections in the course of a process for manufacturing the semiconductor laser device shown in FIG. 8.
Figure 9B:
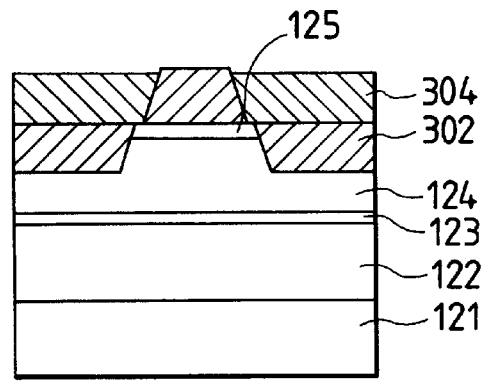
Figure 10A:
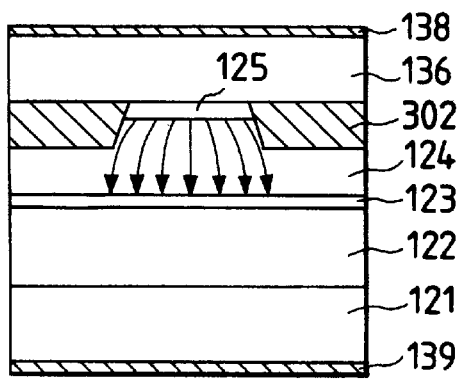
FIG. 10a is a cross-sectional view illustrating a sectional structure of a portion taken along line I—I of the semiconductor laser device shown in FIG. 8.
Figure 10B:
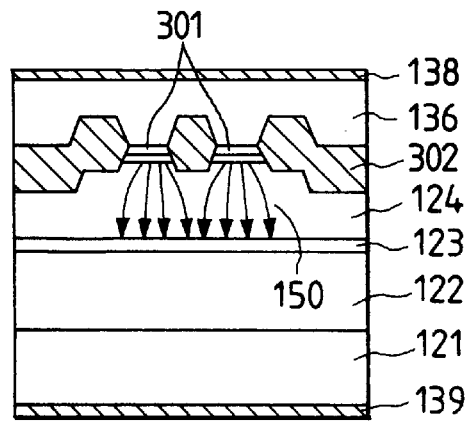
FIG. 10b is a section structural view of a portion taken along line II—II of the semiconductor laser device shown in FIG. 8.

Since the grown n-$(Al_{0.5}Ga_{0.5})_{0.5}In_{0.5}P$ block layer 302 is thin at a shoulder 303 of the stripe as shown in FIG. 9(*a*), it is lightly etched to a position indicated by a dotted line with a hydrochloric acid etchant so that the p-GaAs contact layer 125 of the shoulder 303 can be rendered bare. Here, the contact layer 125 is coated with a photoresist 304 by about 1 $\mu$m as shown in FIG. 9(*b*) and etchbacked with an oxygen plasma. As a result, the surface of the n-$(Al_{0.5}Ga_{0.5})_{0.5}In_{0.5}P$ block layer 302 grown on the stripe is rendered bare. Etching of the n-$(Al_{0.7}Ga_{0.3})_{0.5}P_{0.6}$ block layer 302 with the hydrochloric acid etchant can render only the leading end of the stripe bare without extending to the outside of the stripe because the n-$(Al_{0.5}Ga_{0.5})_{0.5}In_{0.5}P$ block layer 302 breaks off at the stripe shoulder 303.

In order to reduce series resistances of elements, a p-GaAs cap layer 136 is formed after removal of the photoresist 304. A surface electrode 138 composed principally of Au is formed on the surface of a semiconductor wafer and the back of the GaAs substrate 121 is etched by mechanical grinding and chemical etching so that the remaining thickness is set to about 100 $\mu$m. Thereafter, a back electrode 139 composed principally of Au is also formed on the back of the GaAs substrate 121. The semiconductor wafer subjected to such a manufacturing process is cleaved in bar form at about 600 $\mu$m intervals in the lengthwise direction of the stripe.

In the so-formed semiconductor laser device of the present embodiment, the normal-width region 130 is similar in sectional structure to the conventional refractive-index wave-guiding semiconductor laser device as shown in FIG. 10(*a*). On the other hand, since typically-illustrated current paths 150 are formed in the intermediate-width region 131, i.e., a distribution of the amount of current injected is formed therein as shown in FIG. 10(*b*), a refractive index distribution in which the refractive index is large at the central portion of the wave-guiding path stripe, is formed so that a lens effect is obtained. In the structure of the present embodiment, a voltage drop of about 0.2 V is developed because of a voltage drop developed due to a heterobarrier between the p-$Ga_{0.7}In_{0.3}As_{0.4}P_{0.6}$ voltage dropping layer 301 and the GaAs cap layer 136, so that the density of current to be injected into the intermediate-width region 131 is lowered as compared with the normal-width region 130. Thus, upon low output, the lens effect becomes weak and a large spot diameter is obtained. Upon high output on the other hand, the lens effect becomes strong and a small spot diameter is obtained. The relationship between the spot diameter referred to above and the light output can be designed according to the characteristics of the laser beam printer by changing the composition of the p-$Ga_{0.7}In_{0.3}As_{0.4}P_{0.6}$ voltage dropping layer 301. The semiconductor laser device of the present embodiment can obtain a desired change in spot diameter similarly to the second embodiment by forming the surface electrode 138 as a single electrode alone.

Since the n-$(Al_{0.5}Ga_{0.5})_{0.5}In_{0.5}P$ block layer 302 transparent to a laser beam is used as a current blocked layer in the present embodiment, the loss of a resonator of the semiconductor laser device can be reduced and thereby the stripe 130 having the normal-width region can be thinned to a width of 2 $\mu$m. It is thus possible to decrease the operating current to half as compared with the semiconductor laser devices of the first and second embodiments.

Thus, the laser beam printer of the present embodiment using the tri-level printing technique capable of providing multi-color printing in the single optic system can be provided with the function of compensating for the difference in diameter between dots plotted and recorded on a photoconductor and keeping the difference constant in a manner similar to the second embodiment by simply controlling the main current 114 shown in FIG. 1, using the semiconductor laser device having the structure shown in FIGS. 8 and 10 as a light source for the laser beam printer. Further, the laser beam printer is also able to reduce current consumption. Since the difference in dot diameter can be held constant, a laser beam printer can be materialized which is capable of preventing an unintended intermediate region from being formed at the boundary between a low potential region and a high potential region.

<Fourth embodiment>

Figure 11:
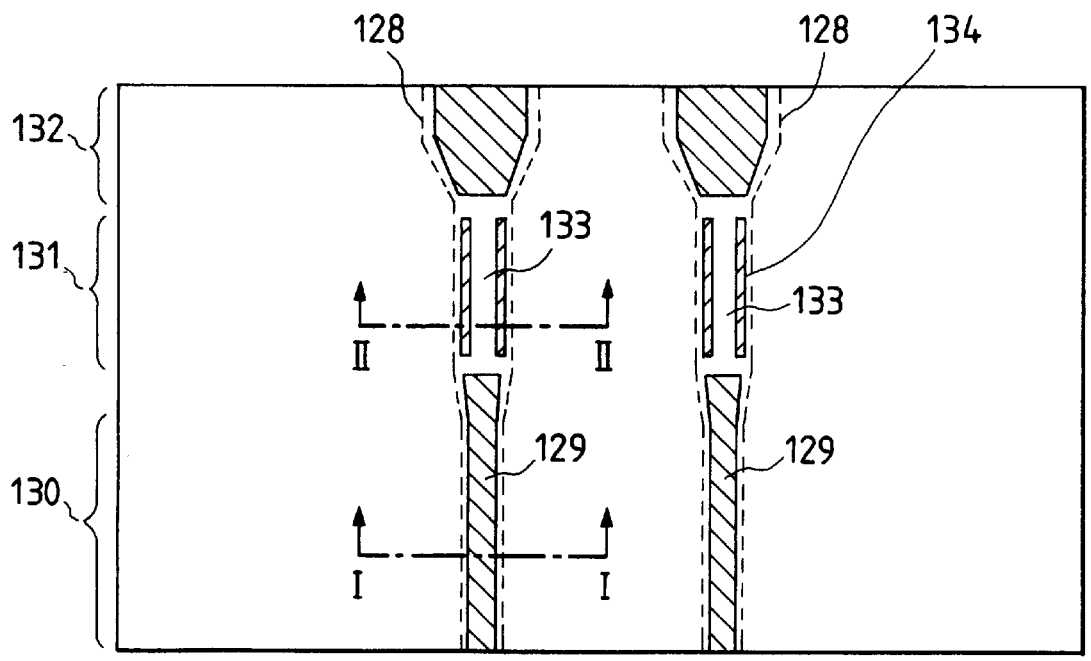
FIG. 11 is a plan view showing a fourth embodiment of a semiconductor laser device according to the present invention.

A laser beam printer according to the present invention and a fourth embodiment of a semiconductor laser device used for a light source of the laser beam printer will be described with reference to FIGS. 11 and 12. An exposure device employed in the laser beam printer according to the present invention is similar in configuration to the third embodiment. However, a group of elements of an array structure in which a plurality of semiconductor laser devices are formed on the same chip, are used for purposes of high-speed printing using a more inexpensive semiconductor laser device. Individual current control for driving the respective semiconductor laser devices in the array structure are performed on a one-system basis. FIG. 11 is a plan view showing the semiconductor laser device having the array structure, according to the present invention, FIG. 12(*a*) is a section structural view of a portion taken along line I—I in FIG. 11, and FIG. 12(*b*) is a section structural view of a portion taken along line II—II in FIG. 11. The semiconductor laser device having such an array structure is formed as follows:

Firstly, an n-$(Al_{0.5}Ga_{0.5})_{0.5}In_{0.5}P$ clad layer 122, a multiple-quantum well active layer 123, a p-$(Al_{0.5}Ga_{0.5})_{0.5}In_{0.5}P$ clad layer 124, a p-$(Al_{0.5}Ga_{0.5})_{0.3}In_{0.7}P$ distortion relaxing layer 401, a p-$(Al_{0.5}Ga_{0.5})_{0.5}In_{0.5}P$ second clad layer 402, a p-GaAs contact layer 125 and p-$Ga_{0.7}In_{0.3}As_{0.4}P_{0.6}$ voltage dropping layers 301 are successively crystal-grown on an substrate 121 by an organometal vapor-phase deposition. The multiple-quantum well active layer 123 is similar in structure to one shown in FIG. 7(*c*) of the second embodiment and is formed by alternately stacking three $Ga_{0.5}In_{0.5}P$ well layers 126 and four $(Al_{0.5}Ga_{0.5})_{0.5}In_{0.5}P$ barrier layers 127.

Next, a complex mask composed of strip-like photoresists 128 and $SiO_2$ 129 is formed in a shape shown in FIG. 11 by using a thermal CVD process and a photolithography technique. In a mask pattern of each photoresist 128, a stripe 130 assuming most of elements and having a normal width (about 2 $\mu$m) expands into two-stage regions: a region 131 having an intermediate width and a region 132 expanded in flare form, in the vicinity of an end surface thereof. After portions of each p-$Ga_{0.7}In_{0.3}As_{0.4}P_{0.6}$ voltage dropping layer 301, the p-GaAs contact layer 125 and the p-$(Al_{0.5}Ga_{0.5})_{0.5}In_{0.5}P$ clad layer 124 have been etched with each photoresist 128 as a mask, the photoresists 128 are removed. Thereafter, the so-processed product is etched by about 0.5 $\mu$m again with each remaining $SiO_2$ 129 as a mask.

After removal of the SiO$_2$ mask, an SiN layer 403 (whose thickness is 1.2 μm) is next deposited on the stripe by a plasma CVD process. Since the deposited SiN layer 403 is rendered thin at a shoulder of the stripe in a manner similar to the structure shown in FIG. 9, the p-Ga$_{0.7}$In$_{0.3}$As$_{0.4}$P$_{0.6}$ voltage dropping layer 301 at each shoulder can be rendered bare by lightly etching the SiN layer 403 with a hydrofluoric acid etchant. Next, the photoresist is applied onto its corresponding layer by about 1 μm and etchbacked with an oxygen plasma. As a result, the surface of the SiN layer 403 deposited on the stripe is rendered bare. Etching of the SiN layer 403 by a CF4 plasma can render only the leading end of the stripe bare without extending to a region other than the stripe because the SiN layer 403 breaks at each stripe shoulder.

A surface electrode 138 composed principally of Au is formed on the surface of a semiconductor wafer and the back of the GaAs substrate 121 is etched by mechanical grinding and chemical etching so that the remaining thickness is set to about 100 μm. Thereafter, a back electrode 139 composed principally of Au is also formed on the back of the GaAs substrate 121. The semiconductor wafer subjected to such a manufacturing process is cleaved in bar form at about 600 μm intervals in the lengthwise direction of the stripe.

Figure 12A:
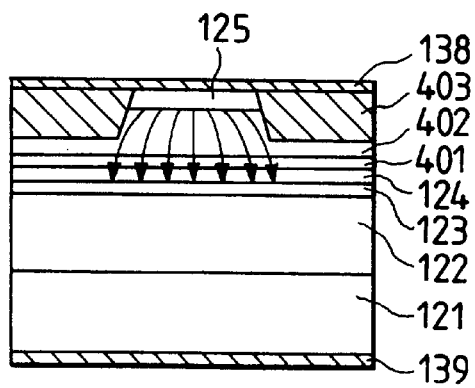
FIG. 12a is a cross-sectional view illustrating a sectional structure of a portion taken along line I—I of the semiconductor laser device shown in FIG. 11.
Figure 12B:
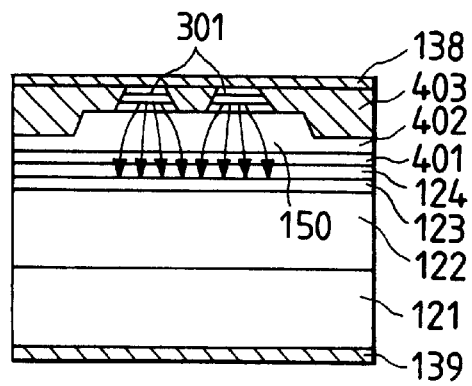
FIG. 12b is a section structural view of a portion taken along line II—II of the semiconductor laser device shown in FIG. 11.

In the so-formed individual semiconductor laser devices in the array structure, of the present embodiment, the normal-width region 130 shown in FIG. 12(a) is similar in sectional structure to the conventional refractive-index wave-guiding semiconductor laser device. On the other hand, since typically-illustrated current paths 150 are formed in the intermediate-width region 131, i.e., a distribution of the amount of current injected is formed therein as shown in FIG. 12(b), a refractive index distribution in which the refractive index is large at the central portion of the wave-guiding path stripe, is formed so that a lens effect is obtained. In the structure of the present embodiment, a voltage drop of about 0.2 V is developed because of a voltage drop developed due to a heterobarrier between the p-Ga$_{0.7}$In$_{0.3}$As$_{0.4}$P$_{0.6}$ voltage dropping layer 301 and the GaAs contact layer 125, so that the density of current to be injected into the intermediate-width region 131 is lowered as compared with the normal-width region 130. Thus, upon low output, the lens effect becomes weak and a large spqt is obtained. Upon high output on the other hand, the lens effect becomes strong and a small spot is obtained. Since the relationship between the diameter of such a spot and the light output can be set to a desired value by changing the composition of the p-Ga$_{0.7}$In$_{0.3}$As$_{0.4}$P$_{0.6}$ voltage dropping layer 301, the spot diameter and the light output can be designed according to the characteristics of the laser beam printer. As a result of embedding of the SiN layer 403 in place of the crystal, stress distortion occurs in the crystal. However, since the stress distortion is absorbed by the p-(Al$_{0.5}$Ga$_{0.5}$)$_{0.3}$In$_{0.7}$P distortion relaxing layer 401, the current blocked layer, which has heretofore been formed by the crystal growth, can be formed by a simple plasma CVD process without the characteristic and reliability of each element being affected by the stress distortion. Therefore, only the advantage of the manufacturing cost can be obtained. Each semiconductor laser device of the present embodiment can obtain a desired change in spot diameter in a manner similar to the second embodiment even if the surface electrode 138 is of a single electrode.

Thus, the laser beam printer of the present embodiment using the tri-level printing technique capable of providing multi-color printing in the single optic system can be provided with the function of compensating for the difference in diameter between dots plotted and recorded on a photoconductor and keeping the difference constant in a manner similar to the second embodiment by simply controlling the main current 114 shown in FIG. 1 over each semiconductor laser device, using each semiconductor laser device ih the array structure shown in FIGS. 11 and 12 as a light source for the laser beam printer. Further, the laser beam printer is able to perform higher-speed printing because a plurality of scanning lines can be simultaneously plotted by the plurality of semiconductor laser devices formed in array form. It is needless to say that since each semiconductor laser device can keep the difference in dot diameter constant, a laser beam printer can be materialized which is capable of preventing an unintended intermediate region from being formed at the boundary between a low potential region and a high potential region.

<Fifth embodiment>

Figure 13:
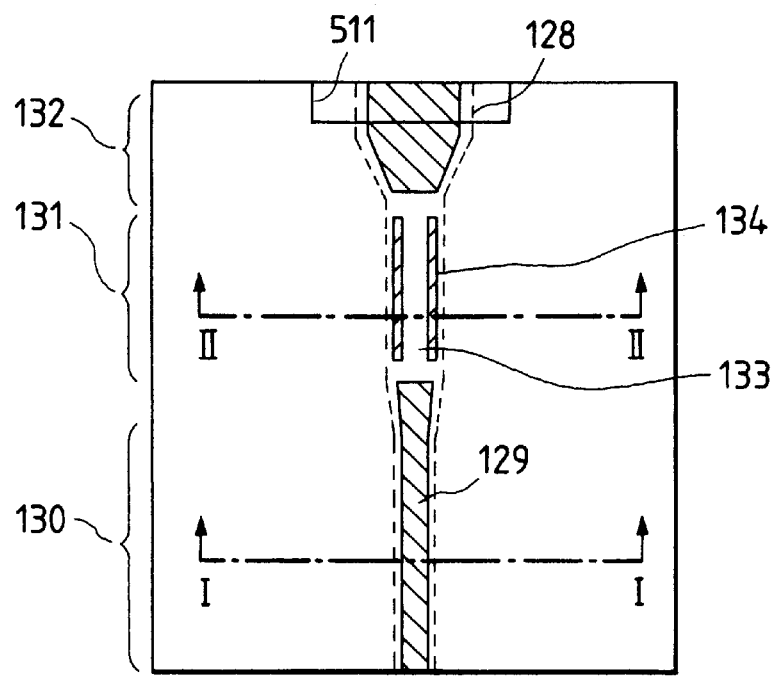
FIG. 13 is a plan view showing a fifth embodiment of a semiconductor laser device according to the present invention.
Figure 14:
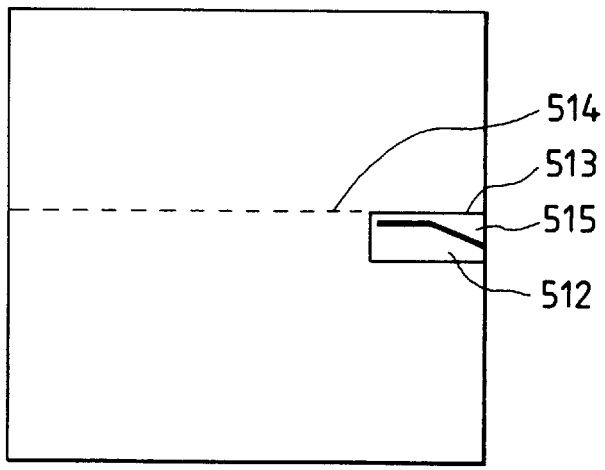
FIG. 14 is a plan view typically illustrating a cleavage inductive groove defined in a portion of a semiconductor wafer and flaws produced by a scriber.
Figure 15A:
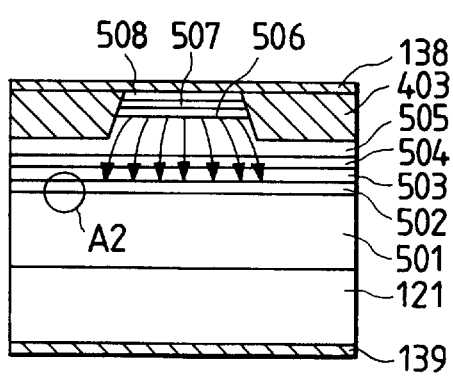
FIG. 15a is a section structural view of a portion taken along line I—I of the semiconductor laser device shown in FIG. 13.
Figure 15B:
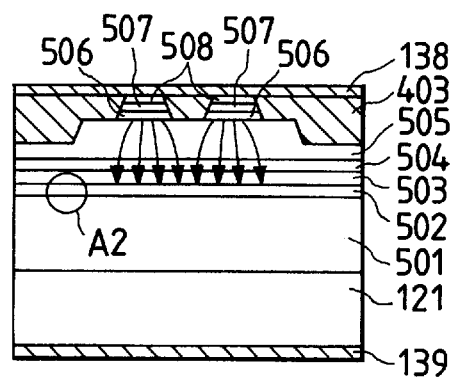
FIG. 15b is a section structural view of a portion taken along line II—II of the semiconductor laser device shown in FIG. 13.
Figure 15C:
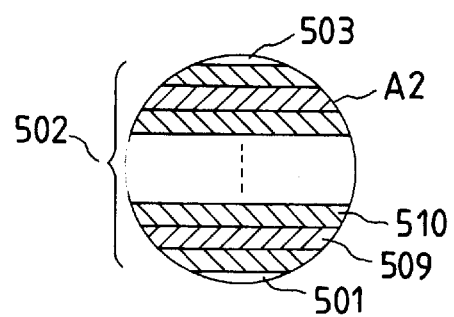

A laser beam printer according to the present invention and a fifth embodiment of a semiconductor laser device used for a light source of the laser beam printer will be described with reference to FIGS. 13 through 15. An exposure device employed in the laser beam printer according to the present invention is similar in configuration to the fourth embodiment. However, the semiconductor laser device is not formed in an array structure. The semiconductor laser device to be used may utilize the same elements as those employed in the second embodiment. In the present embodiment, however, a semiconductor laser device having a structure capable of providing low cost at a shorter wavelength is used. FIG. 13 is a plan view showing the semiconductor laser device of the present embodiment, FIG. 15(a) is a section structural view of a portion taken along line I—I in FIG. 13, FIG. 15(b) is a section structural view of a portion taken along line II—II in FIG. 13, and FIG. 15(c) is an enlarged view of a circular region indicated by A2 in FIG. 15(a). The semiconductor laser device having such a structure is formed as follows:

Firstly, an n-Zn$_{0.86}$Mg$_{0.14}$S$_{0.1}$Se$_{0.9}$ clad layer 501, a multiple-quantum well active layer 502, a p-Zn$_{0.86}$Mg$_{0.14}$S$_{0.1}$Se$_{0.9}$ clad layer 503, a p-Zn$_{0.86}$Mg$_{0.14}$Se distortion absorbing layer 504, a p-Zn$_{0.86}$Mg$_{0.14}$S$_{0.1}$Se$_{0.9}$ clad layer 505, a p-ZnSe cap layer 506, a ZnSe/TnTe superlattice layer 507, and a ZnTe contact layer 508 are successively crystal-grown on an n-GaAs substrate 121 by an organometal vapor-phase deposition. The multiple-quantum well active layer 502 is formed by alternately stacking six ZnCdSe well layers 509 and seven ZnSSe barrier layers 510 as shown in FIG. 15(c). Further, the n-GaAs substrate 121 has a window forming groove 511 having a length of 20 μm extending in the direction orthogonal to a stripe, a length of 5 μm extending in the direction parallel to the stripe and a depth of about 0.5 μm, which groove is provided within a region corresponding to a laser end surface.

Next, a complex mask composed of a strip-like photoresist 128 and SiO$_2$ 129 is formed in a shape shown in FIG. 13 by using a thermal CVD process and a photolithography technique. In a mask pattern of the photoresist 128, a stripe 130 assuming most of elements and having a normal width (about 2 μm) expands into two-stage regions: a region 131 having an intermediate width and a region 132 expanded in flare form, in the vicinity of an end surface thereof. After portions from the ZnTe contact layer 508 to the midpoint of the p-Zn$_{0.86}$Mg$_{0.14}$S$_{0.1}$Se$_{0.9}$ clad layer 505 have been etched with the clad layer left behind by about 0.5 μm, using the photoresist 128 as a mask, the photoresist 128 is removed. Thereafter, even the p-ZnSe cap layer 506 is further etched with the remaining SiO$_2$ as a mask.

After removal of the SiO$_2$ mask, a SiN layer 403 (whose thickness is 1.2 μm) is next deposited on the stripe by a plasma CVD process. Since the deposited SiN layer 403 is rendered thin at a shoulder of the stripe, the ZnTe contact layer 508 at the shoulder of the stripe can be rendered bare by lightly etching the SiN layer 403 with a hydrofluoric acid etchant in a manner similar to the fourth embodiment. Next, the photoresist is applied onto its corresponding layer by about 1 μm and etchbacked with an oxygen plasma. As a result, the surface of the SiN layer 403 deposited on the stripe is rendered bare. Etching of the SiN layer 403 by a CF4 plasma can render only the leading end of the stripe bare.

A surface electrode 138 composed principally of Au is formed on the surface of a semiconductor wafer and the back of the GaAs substrate 121 is etched by mechanical grinding and chemical etching so that the remaining thickness is set to about 100 μm. Thereafter, a back electrode 139 composed principally of Au is also formed on the back of the GaAs substrate 121. A cleavage guiding groove 512 having a depth of about 10 μm, a width of about 20 μm and a length of 100 μm is defined in a portion of the semiconductor wafer subjected to such a manufacturing process so that one side thereof coincides with the center 514 of the window forming groove as shown in FIG. 14. A flaw 515 is made to a crystal by displacing a diamond scriber at a predetermined angle excluding zero with respect to the cleavage guiding groove 512. Using this, the semiconductor wafer is cleaved in bar form at about 600 μm intervals in the lengthwise direction of the stripe. Since the flaw 515 produced by the diamond scriber is guided so as to coincide with one side 513 of the cleavage guiding groove 512, the cleavage position falls within an error of about 1 μm. FIG. 14 is a plan view typically showing only the cleavage guiding groove 512 defined in the portion of the semiconductor wafer, the one side 513, the center 514 and the flaw 515. Other portions are omitted from FIG. 14.

In the so-formed semiconductor laser device of the present embodiment, the normal-width region 130 is similar in sectional structure to the conventional refractive-index wave-guiding semiconductor laser device as shown in FIG. 15(a). On the other hand, since typically-illustrated current paths 150 are formed in the intermediate-width region 131, i.e., a distribution of the amount of current injected is formed therein as shown in FIG. 15(b), a refractive index distribution in which the refractive index is large at the central portion of the wave-guiding path stripe, is formed so that a lens effect is obtained. Since a current path in the intermediate-width region 131 is partially interrupted, the density of the current to be injected into the intermediate-width region 131 is lowered as compared with the normal-width region 130. Thus, when a laser output is low, the lens effect becomes weak and a large spot diameter is obtained. On the other hand, when the laser output is high, the lens effect becomes strong and a small spot diameter is obtained. Since the relationship between the spot diameter obtained in this way and the light output can be set to a desired value by changing the density of the current in the intermediate-width region 131, the spot diameter and the light output can be designed according to the characteristics of the laser beam printer. The semiconductor laser device of the present embodiment can obtain a desired change in spot diameter similarly to the second embodiment even if the surface electrode 138 is of a single electrode. Further, the semiconductor laser device of the present embodiment has an advantage that the wavelength can be shortened by use of the group II–VI materials as well as a price advantage using the SiN layer similar to that employed in the fourth embodiment.

Thus, the laser beam printer of the present embodiment using the tri-level printing technique capable of providing multi-color printing in the single optic system can be provided with the function of compensating for the difference in diameter between dots plotted and recorded on a photoconductor and keeping the difference constant in a manner similar to the second embodiment by simply controlling the main current 114 shown in FIG. 1, using the semiconductor laser device having the structure shown in FIGS. 13 and 15 as a light source for the laser beam printer. Further, the laser beam printer is able to perform high-definition printing owing to the shortening of the wavelength. It is needless to say that since the semiconductor laser device can keep the difference in dot diameter constant, a laser beam printer can be materialized which is capable of preventing an unintended intermediate region from being formed at the boundary between a low potential region and a high potential region.

<Sixth embodiment>

Figure 16:
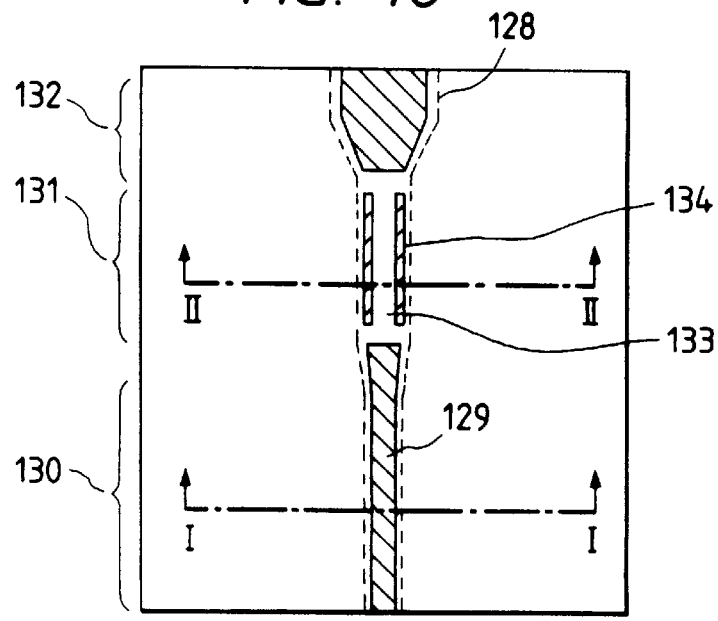
FIG. 16 is a plan view showing a sixth embodiment of a semiconductor laser device according to the present invention.
Figure 17A:
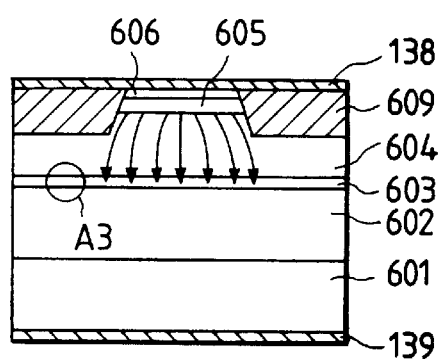
FIG. 17a is a cross-sectional view illustrating a sectional structure of a portion taken along line I—I of the semiconductor laser device shown in FIG. 16.
Figure 17B:
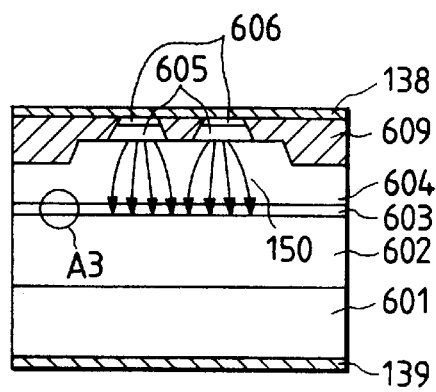
FIG. 17b is a section structural view of a portion taken along line II—II of the semiconductor laser device shown in FIG. 16.
Figure 17C:
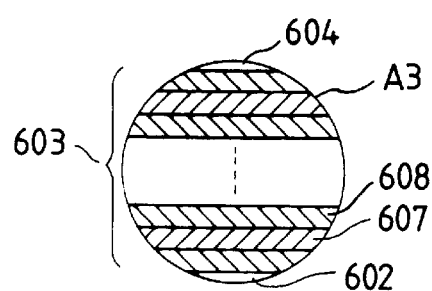

A laser beam printer according to the present invention and a sixth embodiment of a semiconductor laser device used for a light source of the laser beam printer will be described with reference to FIGS. 16 and 17. An exposure device employed in the laser beam printer of the present embodiment is similar in configuration to the second embodiment. The current control for driving the semiconductor laser device is performed on a one-system basis. Accordingly, the current 115 shown in FIG. 1 becomes unnecessary. In the present embodiment, the semiconductor laser device using a GaN-system semiconductor whose wavelength is shorter, is used as the light source for the laser beam printer. The structure of the present semiconductor laser device is shown in FIGS. 16 and 17. FIG. 16 is a plan view showing the semiconductor laser device of the present embodiment, FIG. 17(a) is a section structural view of a portion taken along line I—I in FIG. 16, FIG. 17(b) is a section structural view of a portion taken along line II—II in FIG. 16, and FIG. 17(c) is an enlarged view of a circular region indicated by A3 in FIG. 17(a). The semiconductor laser device having such a structure is formed as follows:

Firstly, an n-Al$_{0.2}$Ga$_{0.8}$N clad layer 602, a multiple-quantum well active layer 603, a p-Al$_{0.2}$Ga$_{0.8}$N clad layer 604, a p-GaN cap layer 605 and a GaN/GaNAs superlattice contact layer 606 are successively crystal-grown on an n-siC substrate 601 by an organometal vapor-phase deposition. The multiple-quantum well active layer 603 is formed by alternately stacking six Ga0.7In0.3N well layers 607 and seven Al$_{0.1}$Ga$_{0.9}$N barrier layers 608 as shown in FIG. 17(c).

Next, a complex mask composed of a strip-like photoresist 128 and SiO$_2$ 129 is formed in a shape shown in FIG. 16 by using a thermal CVD process and a photolithography technique. In a mask pattern of the photoresist 128, a stripe 130 assuming most of elements and having a normal width (about 2 μm) expands into two-stage regions: a region 131 having an intermediate width and a region 132 expanded in flare form, in the vicinity of an end surface thereof. After portions from the GaN/GaNAs superlattice contact layer 606 to the midpoint of the p-Al$_{0.2}$Ga$_{0.8}$N clad layer 604 have been etched with the clad layer left behind by about 0.5 μm, using the photoresist 128 as a mask, the photoresist 128 is removed. Thereafter, even the p-GaN cap layer 605 is further etched with the remaining SiO$_2$ 129 as a mask.

Next, an n-Al$_{0.3}$Ga$_{0.7}$N layer 609 is selectively grown with SiO$_2$ 129 as a mask. A surface electrode 138 composed principally of Au is formed on the surface of a semiconductor wafer and the back of the SiC substrate 601 is etched by mechanical grinding and chemical etching so that the remaining thickness is set to about 100 μm. Thereafter, a back electrode 139 composed principally of Au is also formed on the back of the SiC substrate 601. The semiconductor wafer subjected to such a manufacturing process is cleaved in bar form at about 600 μm intervals in the lengthwise direction of the stripe 130.

In the so-formed semiconductor laser device of the present embodiment, the normal-width region 130 is similar in structure to the conventional refractive-index waveguiding semiconductor laser device as shown in FIG. 17(*a*). On the other hand, since typically-illustrated current paths are formed in the intermediate-width region 131, i.e., a distribution of the amount of current injected is formed therein as shown in FIG. 17(*b*), a refractive index distribution in which the refractive index is large at the central portion of the wave-guiding path stripe, is formed so that a lens effect is obtained. Since a current path in the intermediate-width region 131 is partially interrupted, the density of the current to be injected into the intermediate-width region 131 is lowered as compared with the normal-width region 130. Thus, when a laser output is low, the lens effect becomes weak and a large spot diameter is obtained. On the other hand, when the laser output is high, the lens effect becomes strong and a small spot diameter is obtained. Since the relationship between the spot diameter obtained in this way and the light output can be set to a desired value by changing the density of the current in the intermediate-width region 131, the spot diameter and the light output can be designed according to the characteristics of the laser beam printer. The semiconductor laser device of the present embodiment can obtain a desired change in spot diameter similarly to the second embodiment even if the surface electrode 138 is of a single electrode. Further, the semiconductor laser device of the present embodiment has an advantage that the wavelength can be further shortened by use of GaN materials as well as a price advantage using an SiN layer similar to that employed in the fifth embodiment.

Thus, the laser beam printer of the present embodiment using the tri-level printing technique capable of providing multi-color printing in the single optic system can be provided with the function of compensating for the difference in diameter between dots plotted and recorded on a photoconductor and keeping the difference constant in a manner similar to the second embodiment by simply controlling the main current 114 shown in FIG. 1, using the semiconductor laser device having the structure shown in FIGS. 16 and 17 as a light source for the laser beam printer. Further, the laser beam printer is able to perform higher-definition printing owing to the further shortening of the wavelength. It is needless to say that since the semiconductor laser device can keep the difference in dot diameter constant, a laser beam printer can be materialized which is capable of preventing an unintended intermediate region from being formed at the boundary between a low potential region and a high potential region.

Although the preferred embodiments of the present invention have been described above, the present invention is not necessarily limited to or by these embodiments. It will be apparent to those skilled in the art that various changes in design can be made without departing from the spirit or scope of the invention as set forth herein. Although the crystal growth has been described using the organometal vapor-phase deposition, the molecular beam epitaxy may be used. It is needless to say that the semiconductor laser device according to the present invention, which has the spot-diameter adjusting function can be used for one other than the light source for the laser beam printer.

According to the present invention as is apparent from the aforementioned embodiments or the like, the color laser beam printer of a type wherein a plurality of colors are printed in the single optic system by modulating the intensity of exposed light, can uniformly set the diameter of each of dots recorded every colors and also prevent the unintended intermediate-potential region corresponding to the white from being formed at the boundary between the low potential region and the high potential region.

Since the semiconductor laser device according to the present invention has the adjusting function capable of easily setting the relationship between the spot diameter and the light output to the desired value under the control of the drive current, it can be suitably used for the color laser beam printer using the tri-level printing technique.

What is claimed is:

1. Apparatus comprising a semiconductor laser device having an active layer composed of at least two semiconductor layers different in conduction type from each other and a semiconductor layer interposed between said two semiconductor layers and having a forbidden band width narrower than said two semiconductor layers, and a waveguiding structure for guiding light in one direction parallel to said active layer, said wave-guiding structure being configured or having a refractive-index distribution formed therein so as to provide a spot diameter adjusting function for changing the shape of a spot at a laser end surface on a small size upon high output and on a large size upon low output according to the shape of said wave-guiding structure or the refractive-index distribution formed within said wave-guiding structure.

2. Apparatus according to claim 1, wherein said wave-guiding structure is constructed so that currents are injected through two parallel stripes at at least a portion of said wave-guiding structure so as to provide said spot diameter adjusting function.

3. Apparatus according to claim 2, wherein said wave-guiding structure is constructed to provide a distribution so that the density of current to be injected into a stripe of said two parallel stripes and the density of current to be injected into a portion of said wave-guiding structure other than said two parallel stripes respectively take values different from each other with respect to the same applied voltage so as to provide said spot diameter adjusting function.

4. Apparatus according to claim 3, wherein said wave-guiding structure is constructed so that current non-blocked and blocked regions whose sizes do not exceed 10 μm, are respectively provided within said two parallel stripes in mixed form to form a distribution of said injected current density.

5. Apparatus according to claim 3, wherein said wave-guiding structure is constructed so that said current density distribution to be formed is obtained by providing additive resistances or electrical barriers in a current path.

6. Apparatus comprising a semiconductor laser device having an active layer composed of at least two semiconductor layers different in conduction type from each other and a semiconductor layer interposed between said two semiconductor layers and having a forbidden band width narrower than said two semiconductor layers, a waveguiding structure for guiding light in one direction parallel to said active layer, said wave-guiding structure being configured or having a refractive-index distribution formed therein so as to provide a spot diameter adjusting function for changing the shape of a spot at a laser end surface on a small size upon high output and on a large size upon low output according to the shape of said wave-guiding structure or the refractive-index distribution formed within said wave-guiding structure, a multi-color laser beam printer, wherein said semiconductor laser device serves as a laser light source of said multi-color laser beam printer, said multi-color laser beam printer having the function of exposing a photoconductor with a laser beam emitted from said laser light source to thereby change the electric potential on the surface of the photoconductor so that the state of adhesion of colored particles is changed, transferring the colored particles to an object to be printed to perform printing, said colored particles having at least two types of colors and charge polarity, and setting a plurality of charge quantities according to the intensity of the exposed laser beam, thereby selecting particles to adhere, said multi-color laser beam printer including the spot diameter adjusting function which is capable of changing the shapes of spots of an outgoing beam and an exposing beam according to the intensity of the laser beam and an exposing beam according to the intensity of the laser beam so that when the output of said laser light source is low, a spot diameter is changed to be larger and when the output thereof is high, the spot diameter is changed to be smaller.

7. Apparatus according to claim 6, wherein wave-guiding structure is constructed so that the change in the spot shape is automatically achieved according to the intensity of the laser beam.

8. Apparatus according to claim 7, wherein said laser light source itself is constructed so as to provide said spot diameter adjusting function.

9. Apparatus comprising a multi-color laser beam printer having the function of exposing a photoconductor with a laser beam emitted from a laser light source to thereby change the potential on the surface of the photoconductor so that the state of adhesion of colored particles is changed, transferring the colored particles to an object to be printed to perform printing, said colored particles having at least two types of colors and charge polarity, and setting a plurality of charge quantities according to the intensity of the exposed laser beam, thereby selecting particles to adhere, including:

a spot diameter adjusting function capable of changing the shapes of spots of an outgoing beam and an exposing beam according to the intensity of the laser beam so that when the output of said laser light source is low, a spot diameter is changed to be larger and when the output thereof is high, the spot diameter is changed to be smaller, wherein said laser light source is a semiconductor laser device having an active layer composed of at least two semiconductor layers different in conduction type from each other and a semiconductor layer interposed between said two semiconductor layers and having a forbidden bandwidth narrower than said two semiconductor layers, and a wave-guiding structure for guiding light in one direction parallel to said active layer, wherein said wave-guiding structure is configured or has a refractive index distribution formed therein so as to provide changing the shape of a spot at a laser end surface on a small size upon high output and on a large size upon low output according to the shape of said wave-guiding structure or the refractive-index distribution formed within said wave-guiding structure.

* * * * *